US012805374B2

(12) United States Patent
Theil et al.

(10) Patent No.: US 12,805,374 B2
(45) Date of Patent: Nov. 17, 2026

(54) CONDUCTIVE MATERIALS FOR DIRECT BONDING

(71) Applicant: ADEIA SEMICONDUCTOR BONDING TECHNOLOGIES INC., San Jose, CA (US)

(72) Inventors: Jeremy Alfred Theil, Mountain View, CA (US); Cyprian Emeka Uzoh, San Jose, CA (US); Guilian Gao, Campbell, CA (US); Belgacem Haba, Saratoga, CA (US); Laura Wills Mirkarimi, Sunol, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 311 days.

(21) Appl. No.: 18/391,173

(22) Filed: Dec. 20, 2023

(65) Prior Publication Data

US 2025/0006679 A1 Jan. 2, 2025

Related U.S. Application Data

(60) Provisional application No. 63/524,564, filed on Jun. 30, 2023.

(51) Int. Cl.
*H10W 72/90* (2026.01)
*H10W 72/00* (2026.01)
(Continued)

(52) U.S. Cl.
CPC ......... *H10W 72/90* (2026.01); *H10W 72/019* (2026.01); *H10W 99/00* (2026.01);
(Continued)

(58) Field of Classification Search
None
See application file for complete search history.

(56) References Cited

U.S. PATENT DOCUMENTS 5,753,536 A 5/1998 Sugiyama et al.
5,771,555 A 6/1998 Eda et al.
(Continued)

FOREIGN PATENT DOCUMENTS

CN 112730560 A 4/2021
CN 114308161 A 4/2022
(Continued)

OTHER PUBLICATIONS

Aleksandrova et al., Electrical Characterization of PEDOT: PSS Anodes by Impedance Measurements. IJTPE Journal-Microelectron Int'l. Jan. 4, 2016;33(1): 47-52.
(Continued)

*Primary Examiner* — Nicholas J Tobergte
(74) *Attorney, Agent, or Firm* — Knobbe, Martens, Olson & Bear, LLP

(57) ABSTRACT

A structure includes a first substrate including a first layer having at least one electrically conductive first portion and at least one electrically insulative second portion and a second substrate including a second layer having at least one electrically conductive third portion and at least one electrically insulative fourth portion. The structure further includes an interface layer having at least one electrically conductive oxide material between the first layer and the second layer. The at least one electrically conductive oxide material includes at least one first region between and in electrical communication with the at least one electrically conductive first portion and the at least one electrically conductive third portion, and at least one second region
(Continued)

between the at least one electrically insulative second portion and the at least one electrically insulative fourth portion.

25 Claims, 15 Drawing Sheets

(51) Int. Cl.
*H10W 99/00* (2026.01)
*H10W 80/00* (2026.01)
*H10W 90/00* (2026.01)

(52) U.S. Cl.
CPC .... *H10W 72/01908* (2026.01); *H10W 72/951* (2026.01); *H10W 72/952* (2026.01); *H10W 72/981* (2026.01); *H10W 80/312* (2026.01); *H10W 80/327* (2026.01); *H10W 90/792* (2026.01)

(56) References Cited

U.S. PATENT DOCUMENTS 6,080,640 A 6/2000 Gardner et al.
6,423,640 B1 7/2002 Lee et al.
6,465,892 B1 10/2002 Suga
6,887,769 B2 5/2005 Kellar et al.
6,908,027 B2 6/2005 Tolchinsky et al.
7,045,453 B2 5/2006 Canaperi et al.
7,105,980 B2 9/2006 Abbott et al.
7,193,423 B1 3/2007 Dalton et al.
7,387,944 B2 6/2008 Tong et al.
7,750,488 B2 7/2010 Patti et al.
7,803,693 B2 9/2010 Trezza
8,183,127 B2 5/2012 Patti et al.
8,349,635 B1 1/2013 Gan et al.
8,377,798 B2 2/2013 Peng et al.
8,441,131 B2 5/2013 Ryan
8,476,165 B2 7/2013 Trickett et al.
8,482,132 B2 7/2013 Yang et al.
8,486,758 B2 7/2013 Oganesian et al.
8,501,537 B2 8/2013 Sadaka et al.
8,524,533 B2 9/2013 Tong et al.
8,620,164 B2 12/2013 Heck et al.
8,647,987 B2 2/2014 Yang et al.
8,697,493 B2 4/2014 Sadaka
8,709,913 B2 4/2014 Oganesian et al.
8,716,105 B2 5/2014 Sadaka et al.
8,802,538 B1 8/2014 Liu
8,809,123 B2 8/2014 Liu et al.
8,841,002 B2 9/2014 Tong
8,945,303 B2 2/2015 Wakamatsu et al.
9,093,350 B2 7/2015 Endo et al.
9,142,517 B2 9/2015 Liu et al.
9,171,756 B2 10/2015 Enquist et al.
9,184,125 B2 11/2015 Enquist et al.
9,224,704 B2 12/2015 Landru
9,230,941 B2 1/2016 Chen et al.
9,257,399 B2 2/2016 Kuang et al.
9,299,736 B2 3/2016 Chen et al.
9,312,229 B2 4/2016 Chen et al.
9,331,149 B2 5/2016 Tong et al.
9,337,235 B2 5/2016 Chen et al.
9,385,024 B2 7/2016 Tong et al.
9,391,143 B2 7/2016 Tong et al.
9,394,161 B2 7/2016 Cheng et al.
9,431,368 B2 8/2016 Enquist et al.
9,437,572 B2 9/2016 Chen et al.
9,443,796 B2 9/2016 Chou et al.
9,461,007 B2 10/2016 Chun et al.
9,496,239 B1 11/2016 Edelstein et al.
9,536,848 B2 1/2017 England et al.
9,559,081 B1 1/2017 Lai et al.
9,564,414 B2 2/2017 Enquist et al.
9,620,481 B2 4/2017 Edelstein et al.
9,656,852 B2 5/2017 Cheng et al.
9,716,033 B2 7/2017 Enquist et al.
9,723,716 B2 8/2017 Meinhold
9,728,521 B2 8/2017 Tsai et al.
9,741,620 B2 8/2017 Uzoh et al.
9,799,587 B2 10/2017 Fujii et al.
9,829,699 B1 11/2017 Sakai et al.
9,852,988 B2 12/2017 Enquist et al.
9,893,004 B2 2/2018 Yazdani
9,899,442 B2 2/2018 Katkar
9,929,050 B2 3/2018 Lin
9,941,241 B2 4/2018 Edelstein et al.
9,941,243 B2 4/2018 Kim et al.
9,953,941 B2 4/2018 Enquist
9,960,142 B2 5/2018 Chen et al.
10,002,844 B1 6/2018 Wang et al.
10,026,605 B2 7/2018 Doub et al.
10,075,657 B2 9/2018 Fahim et al.
10,204,893 B2 2/2019 Uzoh et al.
10,269,756 B2 4/2019 Uzoh
10,276,619 B2 4/2019 Kao et al.
10,276,909 B2 4/2019 Huang et al.
10,418,277 B2 9/2019 Cheng et al.
10,434,749 B2 10/2019 Tong
10,446,456 B2 10/2019 Shen et al.
10,446,487 B2 10/2019 Huang et al.
10,446,532 B2 10/2019 Uzoh et al.
10,508,030 B2 12/2019 Katkar et al.
10,522,499 B2 12/2019 Enquist et al.
10,707,087 B2 7/2020 Uzoh et al.
10,784,191 B2 9/2020 Huang et al.
10,790,262 B2 9/2020 Uzoh et al.
10,840,135 B2 11/2020 Uzoh
10,840,205 B2 11/2020 Fountain, Jr. et al.
10,852,545 B2 12/2020 Mohammed et al.
10,854,578 B2 12/2020 Morein
10,879,212 B2 12/2020 Uzoh et al.
10,886,177 B2 1/2021 DeLaCruz et al.
10,892,246 B2 1/2021 Uzoh
10,910,272 B1 2/2021 Zhou et al.
10,923,408 B2 2/2021 Huang et al.
10,923,413 B2 2/2021 DeLaCruz
10,950,547 B2 3/2021 Mohammed et al.
10,964,664 B2 3/2021 Mandalapu et al.
10,985,133 B2 4/2021 Uzoh
10,991,804 B2 4/2021 DeLaCruz et al.
10,998,292 B2 5/2021 Lee et al.
11,004,757 B2 5/2021 Katkar et al.
11,011,494 B2 5/2021 Gao et al.
11,011,503 B2 5/2021 Wang et al.
11,031,285 B2 6/2021 Katkar et al.
11,037,919 B2 6/2021 Uzoh et al.
11,056,348 B2 7/2021 Theil
11,069,734 B2 7/2021 Katkar
11,088,099 B2 8/2021 Katkar et al.
11,127,738 B2 9/2021 DeLaCruz et al.
11,158,573 B2 10/2021 Uzoh et al.
11,158,606 B2 10/2021 Gao et al.
11,169,326 B2 11/2021 Huang et al.
11,171,117 B2 11/2021 Gao et al.
11,176,450 B2 11/2021 Teig et al.
11,195,748 B2 12/2021 Uzoh et al.
11,205,625 B2 12/2021 DeLaCruz et al.
11,244,920 B2 2/2022 Uzoh
11,256,004 B2 2/2022 Haba et al.
11,264,357 B1 3/2022 DeLaCruz et al.
11,276,676 B2 3/2022 Enquist et al.
11,296,044 B2 4/2022 Gao et al.
11,296,053 B2 4/2022 Uzoh et al.
11,329,034 B2 5/2022 Tao et al.
11,348,898 B2 5/2022 DeLaCruz et al.
11,355,404 B2 6/2022 Gao et al.
11,355,443 B2 6/2022 Huang et al.
11,367,652 B2 6/2022 Uzoh et al.
11,373,963 B2 6/2022 DeLaCruz et al.
11,380,597 B2 7/2022 Katkar et al.
11,385,278 B2 7/2022 DeLaCruz et al.
11,387,202 B2 7/2022 Haba et al.
11,387,214 B2 7/2022 Wang et al.
11,393,779 B2 7/2022 Gao et al.

(56) References Cited

U.S. PATENT DOCUMENTS 11,428,942 B2 8/2022 Russell
11,462,419 B2 10/2022 Haba
11,476,213 B2 10/2022 Haba et al.
11,515,291 B2 11/2022 DeLaCruz et al.
11,626,363 B2 4/2023 Haba et al.
11,631,647 B2 4/2023 Haba
2004/0033424 A1 2/2004 Talin et al.
2004/0084414 A1 5/2004 Sakai et al.
2006/0057945 A1 3/2006 Hsu et al.
2006/0272942 A1 12/2006 Sirringhaus
2007/0111386 A1 5/2007 Kim et al.
2008/0230389 A1 9/2008 Ha et al.
2010/0055673 A1 3/2010 Agarwal et al.
2011/0229991 A1 9/2011 Wang et al.
2014/0044900 A1 2/2014 Sparks et al.
2014/0087552 A1 3/2014 di Palma et al.
2014/0175655 A1 6/2014 Chen et al.
2014/0199719 A1 7/2014 Shih et al.
2014/0264291 A1 9/2014 Zhang et al.
2014/0311904 A1 10/2014 Rozlosnik et al.
2015/0064498 A1 3/2015 Tong
2016/0064672 A1 3/2016 Lee et al.
2016/0343682 A1 11/2016 Kawasaki
2018/0073977 A1 3/2018 Wang et al.
2018/0175012 A1 6/2018 Wu et al.
2018/0182639 A1 6/2018 Uzoh et al.
2018/0182666 A1 6/2018 Uzoh et al.
2018/0190583 A1 7/2018 DeLaCruz et al.
2018/0219038 A1 8/2018 Gambino et al.
2018/0323177 A1 11/2018 Yu et al.
2018/0323227 A1 11/2018 Zhang et al.
2018/0331066 A1 11/2018 Uzoh et al.
2018/0331329 A1 11/2018 Andry et al.
2019/0019968 A1 1/2019 He et al.
2019/0097088 A1 3/2019 Huppmann et al.
2019/0115277 A1 4/2019 Yu et al.
2019/0115323 A1 4/2019 Haba et al.
2019/0131277 A1 5/2019 Yang et al.
2019/0319007 A1 10/2019 Uzoh et al.
2019/0385935 A1 12/2019 Gao et al.
2020/0013765 A1 1/2020 Fountain, Jr. et al.
2020/0035641 A1 1/2020 Fountain, Jr. et al.
2020/0194396 A1 6/2020 Uzoh
2020/0282424 A1 9/2020 Oralkan et al.
2020/0294908 A1 9/2020 Haba et al.
2020/0328162 A1 10/2020 Haba et al.
2020/0395321 A1 12/2020 Katkar et al.
2020/0406255 A1 12/2020 Florentino et al.
2021/0035934 A1* 2/2021 Katz .................... H10H 20/018
2021/0098412 A1 4/2021 Haba et al.
2021/0118864 A1 4/2021 DeLaCruz et al.
2021/0143125 A1 5/2021 DeLaCruz et al.
2021/0154660 A1 5/2021 Bauert et al.
2021/0181510 A1 6/2021 Katkar et al.
2021/0193603 A1 6/2021 DeLaCruz et al.
2021/0193624 A1 6/2021 DeLaCruz et al.
2021/0193625 A1 6/2021 Katkar et al.
2021/0205813 A1 7/2021 Iwai et al.
2021/0213448 A1 7/2021 Allen et al.
2021/0217646 A1 7/2021 Liu et al.
2021/0242152 A1 8/2021 Fountain, Jr. et al.
2021/0296282 A1 9/2021 Gao et al.
2021/0305202 A1 9/2021 Uzoh et al.
2021/0366820 A1 11/2021 Uzoh
2021/0367117 A1 11/2021 Xie et al.
2022/0077063 A1 3/2022 Haba
2022/0077087 A1 3/2022 Haba
2022/0091146 A1 3/2022 Huff et al.
2022/0139867 A1 5/2022 Uzoh
2022/0139869 A1 5/2022 Gao et al.
2022/0208650 A1 6/2022 Gao et al.
2022/0208702 A1 6/2022 Uzoh
2022/0208723 A1 6/2022 Katkar et al.
2022/0216167 A1 7/2022 Yang
2022/0246497 A1 8/2022 Fountain, Jr. et al.
2022/0285303 A1 9/2022 Mirkarimi et al.
2022/0319901 A1 10/2022 Suwito et al.
2022/0320035 A1 10/2022 Uzoh et al.
2022/0320036 A1 10/2022 Gao et al.
2023/0005850 A1 1/2023 Fountain, Jr.
2023/0005876 A1 1/2023 Hu
2023/0019869 A1 1/2023 Mirkarimi et al.
2023/0036441 A1 2/2023 Haba et al.
2023/0067677 A1 3/2023 Lee et al.
2023/0069183 A1 3/2023 Haba
2023/0100032 A1 3/2023 Haba et al.
2023/0115122 A1 4/2023 Uzoh et al.
2023/0122531 A1 4/2023 Uzoh
2023/0123423 A1 4/2023 Gao et al.
2023/0125395 A1 4/2023 Gao et al.
2023/0130259 A1 4/2023 Haba et al.
2023/0132632 A1 5/2023 Katkar et al.
2023/0140107 A1 5/2023 Uzoh et al.
2023/0142680 A1 5/2023 Guevara et al.
2023/0154816 A1 5/2023 Haba et al.
2023/0154828 A1 5/2023 Haba et al.
2023/0158500 A1 5/2023 Deng et al.
2023/0187264 A1 6/2023 Uzoh et al.
2023/0187317 A1 6/2023 Uzoh
2023/0187412 A1 6/2023 Gao et al.
2023/0197453 A1 6/2023 Fountain, Jr. et al.
2023/0197496 A1 6/2023 Theil
2023/0197559 A1 6/2023 Haba et al.
2023/0197560 A1 6/2023 Katkar et al.
2023/0197655 A1 6/2023 Theil et al.
2023/0207402 A1 6/2023 Fountain, Jr. et al.
2023/0207437 A1 6/2023 Haba
2023/0207474 A1 6/2023 Uzoh et al.
2023/0207514 A1 6/2023 Gao et al.
2023/0215836 A1 7/2023 Haba et al.
2023/0245950 A1 8/2023 Haba et al.
2023/0268300 A1 8/2023 Uzoh et al.
2023/0299029 A1 9/2023 Theil et al.
2023/0343734 A1 10/2023 Uzoh et al.
2023/0360950 A1 11/2023 Gao
2023/0361074 A1 11/2023 Uzoh et al.
2023/0369136 A1 11/2023 Uzoh et al.
2023/0375613 A1 11/2023 Haba et al.
2024/0038702 A1 2/2024 Uzoh
2024/0055407 A1 2/2024 Workman
2024/0063199 A1 2/2024 Tao et al.
2024/0076725 A1 3/2024 Liu et al.
2024/0079376 A1 3/2024 Suwito et al.
2024/0105674 A1 3/2024 Uzoh et al.
2024/0170411 A1 5/2024 Chang et al.
2024/0186248 A1 6/2024 Haba et al.
2024/0186268 A1 6/2024 Uzoh et al.
2024/0186269 A1 6/2024 Haba
2024/0203917 A1 6/2024 Katkar et al.
2024/0213191 A1 6/2024 Theil et al.
2024/0213210 A1 6/2024 Haba et al.
2024/0217210 A1 7/2024 Zhao et al.
2024/0222239 A1 7/2024 Gao et al.
2024/0222315 A1 7/2024 Uzoh
2024/0222319 A1 7/2024 Gao et al.
2024/0266255 A1 8/2024 Haba et al.
2024/0298454 A1 9/2024 Haba
2024/0304593 A1 9/2024 Uzoh
2024/0312951 A1 9/2024 Theil et al.
2025/0364454 A1 11/2025 Fountain, Jr.
2025/0364512 A1 11/2025 Fountain, Jr.
2026/0047471 A1 2/2026 Mrozek
2026/0121390 A1 4/2026 Uzoh

FOREIGN PATENT DOCUMENTS

CN 116682793 A 9/2023
CN 117065817 A 11/2023
EP 2124039 A1 11/2009
JP 2009-113007 A 5/2009
JP 2013-033786 A 2/2013
JP 2018-160519 10/2018
KR 10-0945800 B1 3/2010
KR 1682915 B1 12/2016

(56) References Cited

FOREIGN PATENT DOCUMENTS

| | | | |
|---|---|---|---|
| KR | 10-2019-0058345 | A | 5/2019 |
| KR | 10-2023-0159381 | A | 11/2023 |
| WO | WO 2005/043584 | A2 | 5/2005 |
| WO | WO 2011/002957 | A2 | 1/2011 |
| WO | WO 2023/122513 | A1 | 6/2023 |
| WO | WO 2024/191791 | A1 | 9/2024 |

OTHER PUBLICATIONS

Benaglia et al., "In Operando Nanomechanical Mapping of PEDOT: PSS Thin Films in Electrolyte Solutions with Bimodal AFM". Nanoscale. 2022;14(38): 14146-14154.
Bhujel et al., "Bandgap Engineering of PEDOT:PSS/rGO a Hole Transport Layer for SiNWs Hybrid Solar Cells". Bull Mater Sci. Jun. 2021;44 (72); 11 pages.
Carter et al., Enhanced Adhesion of PEDOT: PSS to Substrates Using Polydopamine as a Primer. Polymer J. Feb. 2024;56(2): 115-120.
Eom et al., "Highly Conductive Polydopamine Coatings by Direct Electrochemical Synthesis on Au". ACS Appl Polymer Mater. Jul. 19, 2022;4(8): 5319-5329, including Suppl. Info. pp. S-1 to S11.
Iqbal et al., "Recent develpoments in hybrid conducting polymers: Synthesis, applications and future prospects," J Indust Eng Chem. Apr. 25, 2018;60: 53-84.
Koschinski et al., Validation of Transparent and Flexible Neural Implants for Simultaneous Electrophysiology, Functional Imaging, and Optogenetics. J Mater Chem B. 2023;11(40): 9639-9357.
Kumar et al., "Achieving Low Contact Resistivity in PEDOT: PSS/n-Si Solar Cells". Phys Scr. (2023) 035005; 9 pages; https://doi.org/10.1088/1402-4896/acb515.
Lang et al., "Microscopical Investigations of PEDOT: PSS Thin Films". Adv Function Mater. Apr. 23, 2009;19(8): 1215-1220.
Lin et al., "A hyprid bonding interconnection with a novel low-temperature bonding polymer system,"2022 IEEE 72nd Electronic Components and Technology Conference [ECTC]; May 31, 2022, pp. 2128-2134.
Lövenich W., "PEDOT—Properties and Applications". Polymer Science Series Co, Sep. 2014:56(1): 135-153.
Moulé et al., "Mixed interlayers at the interface between PEDOT: PSS and conjugated polymers provide charge transport control". J Mater Chem C. 2015;3(11):2664-2676.
Music et al., "Tuneable Thermal Expansion of Poly (3,4-ethylenedioxythiophene) Polystyrene Sulonate". J Phys Condens Matter (2019) 125101; 8 pages https://doi.org/10.1088/1361-648X/aafdda.
Ng et al., Polymer Electrolyte System Based on Carrageenan-Poly (3, 4-ethylenedioxythiophene)(PEDOT) Composite for Dye Sensitized Solar Cell. In IOP Conference Series: Materials Science and Engineering Apr. 1, 2015 (vol. 79, No. 1, p. 012020). IOP Publishing.
Onsemi AR0820 image, cross section of a CMOS image sensor product. The part in the image was shipped on Sep. 16, 2021. Applicant makes No. representation that the part in the image is identical to the part identified in the separately submitted reference Bush, Nov. 8, 2018, ElectronicsWeekly.com ("Bush article"); however, the imaged part and the part shown in the Bush article share the part number "ONSEMI AR0820.".
Qu et al., Strength and Adhesion Characterization of Electrochemically Deposited Conjugated Polymer Films. Acta Biomater. Feb. 1, 2016;31: 114-121.
Tran et al., "Recent Developments and Implementations of Conductive Polymer-based Flexible Devices in Sensing Applications". Polymers. Sep. 7, 2022;14(18): 3730; 29 pages.
Vizza et al., "Electrodeposition of Cu on PEDOT for a hybrid solid-state electronic device". Surfaces. May 24, 2021;4(2): 157-168.
Wang et al., "Layered Microporous Polymers by Solvent Knitting Method". Sci Adv. Mar. 31, 2017;3(3): e1602610, 9 pages.
Worfolk et al., Ultrahigh Electrical Conductivity in Solution-Sheared Polymeric Transparent Films. PNAS. Nov. 17, 2015;112(46): 14138-14143.
Zhong et al., Chemical Mechanical Polishing of Polymeric Materials for MEMS Applications. Microelectron J. Apr. 1, 2006;37(4): 295-301.
International Search Report and Written Opinion dated Sep. 12, 2024, issued in Application No. PCT/US2024/029254; 14 pages.
Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).
Choi, G.W. et al., "CMP characteristics and optical property of ITO thin film by using silica slurry with a variety of process parameters," Microelectronic Engineering, 2006, vol. 83, pp. 2213-2217.
Heitmann, Ulrike, "Development of ZnO-based transparent conductive adhesive for the application in III-V/silicon tandem solar cells," Dissertation zur Erlangung des Doktorgrades der Technischen Fakultät der Albert-Ludwigs-Universität Freiburg im Breisgau, 2021, 207 pages.
Hönle, M. et al., "Mechanism of indium tin oxide // indium tin oxide direct wafer bonding," Thin Solid Films, 2020, vol. 704, https://doi.org/10/1016/j.tsr.2020/137964, 7 pages.
Huang, C. et al., "Effect of OH- on chemical mechanical polishing of β-Ga2O3 (100) substrate using an alkaline slurry," RSC Advances, 2018, vol. 8, p. 6544, doi: 10.1039/c7ra11570.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Liu, Z.J. et al., "Monolithic LED microdisplay on active matrix substrate using flip-chip technology," IEEE Journal of Selected Topics in Quantum Electronics, 2009, 5 pages, doi.org/10.1109/JSTQE.2009.2015675.
Massoubre, D. et al., "Fabrication of planar GaN-based micro-pixel light emitting diode arrays," 2009 IEEE LEOS Annual Meeting Conf. Proc., 2009, pp. 84-85.
Moriceau, H. et al., "Overview of recent direct wafer bonding advances and applications," Advances in Natural Sciences-Nanoscience and Nanotechnology, 2010, 11 pages.
Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Oberhammer, J. et al., "Sealing of adhesive bonded devices on wafer level," Sensors and|Actuators A, 2004, vol. 110, No. 1-3, pp. 407-412, see pp. 407-412, and Figures 1 (a)-1(I), 6 pages.
Plobi, A. et al., "Wafer direct bonding: tailoring adhesion between brittle materials," Materials Science and Engineering Review Journal, 1999, R25, 88 pages.
Sony IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes norepresentation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image.".
Aleshin et al., Metallic conductivity at low temperatures in poly (3, 4-ethylenedioxythiophene) doped with PF 6. Physical Review B. Aug. 15, 1997 ;56(7):3659-3663.
Chen Y., "Low-temperature processing of poly (3, 4-ethylenedioxythiophene): poly (styrenesulfonate) Hydrogels for Biomedical Applications". Master Thesis; University of California, Los Angeles; 2020; 116 pages.

(56) References Cited

OTHER PUBLICATIONS

Glover et al., A Scanning Kelvin probe investigation of the interaction of PEDOT: PSS films with metal surfaces and potential corrosion protection properties. J Electrochem Soc. Aug. 12, 2015;162(10):H799 in 9 pages.

Li et al., “Study of conductive polymer PEDOT: PSS for infrared thermal detection”. Optical Mater Express. Nov. 1, 2019;9(11): 4474-4482.

Nagamatsu et al., A 12% efficient silicon/PEDOT: PSS heterojunction solar cell fabricated at< 100 C. IEEE J Photovolt. Nov. 20, 2013;4(1): 260-264.

Ong et al., “A brief review of nanoparticles-doped PEDOT: PSS nanocomposite for OLED and OPV”. Nanotech Rev. May 6, 2022;11(1): 1870-1889.

Pattanayak et al., “Microfluidic Chips: Recent Advances, Critical Strategies in Design, Applications and Future Perspectives”. Microfluidics & Nanofluidics. Dec. 2021;25: 1-28.

Sakar et al., Microfluidic Platform to Study Electric Field Based Root Targeting by Pathogenic Zoospores. In 2022 IEEE 35th International Conference on Micro Electro Mechanical Systems Conference (MEMS) Jan. 9, 2022 (pp. 884-887).

Stepien et al., Thermal operating window for PEDOT: PSS films and its related thermoelectric properties. Synthetic Metals. Mar. 1, 2017;225: 49-54.

Wu et al., “Construction of Microfluidic Chips Using Polydimethylsiloxane for Adhesive Bonding”. Lab on a Chip. 2005;5(12): 1393-1398.

International Preliminary Report on Patentability issued Dec. 23, 2025, in Application No. PCT/US2024/029254; 8 pages.

* cited by examiner

FIG. 2A:
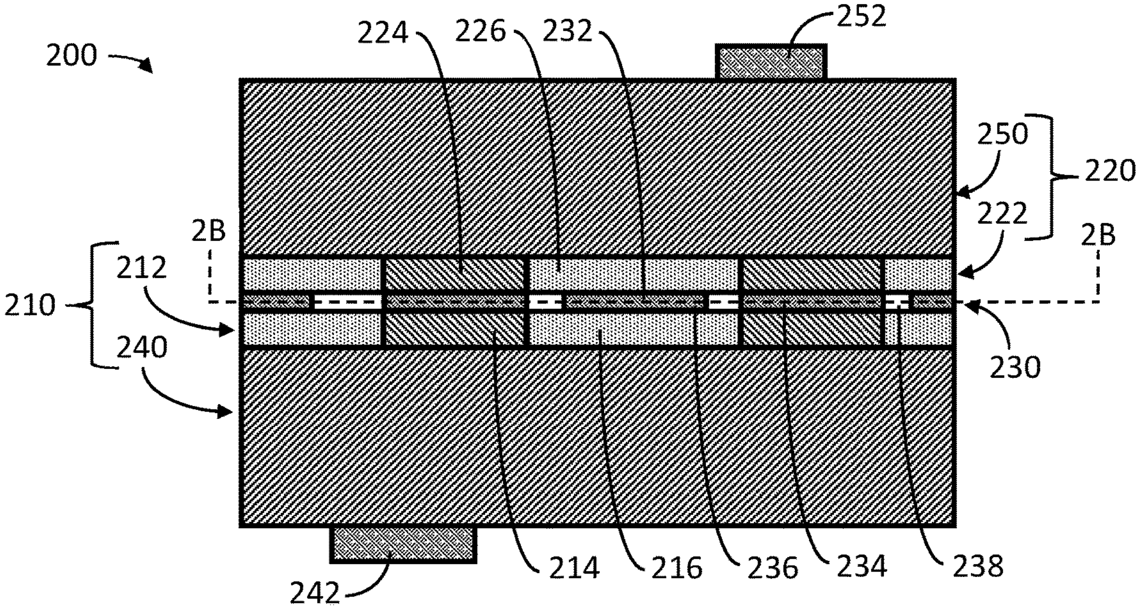
FIG. 2B:
FIG. 2C:
FIG. 2D:
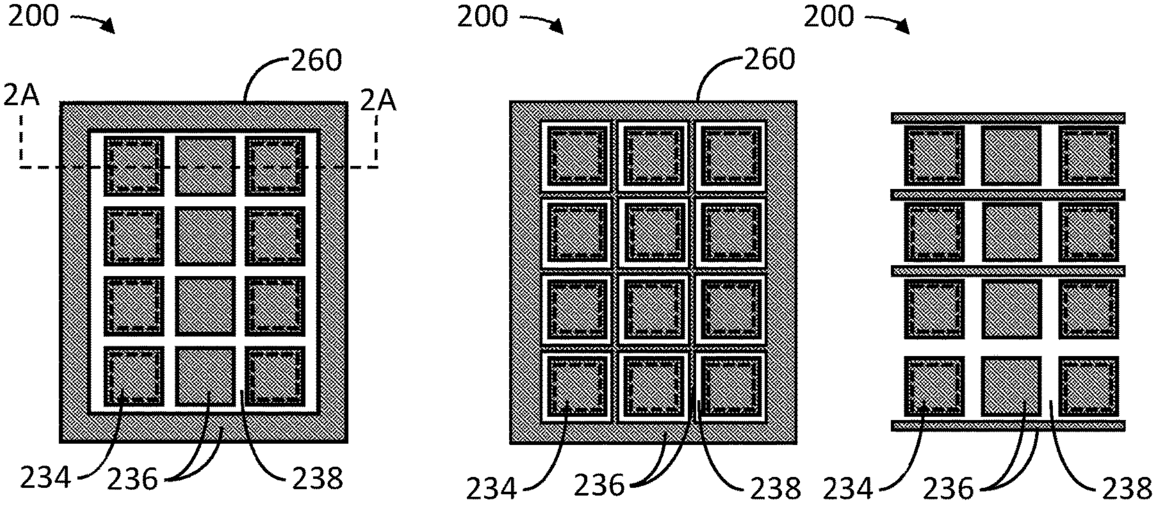

CONDUCTIVE MATERIALS FOR DIRECT BONDING

BACKGROUND

Field

The field relates to systems and methods for wafer-to-wafer, die-to-die, and/or die-to-wafer hybrid bonding for semiconductor devices and optoelectronic devices.

Description of the Related Art

Semiconductor elements, such as semiconductor wafers or integrated device dies, can be stacked and directly bonded to one another without an adhesive, thereby forming a bonded structure. Nonconductive (e.g., dielectric; semiconductor) surfaces can be made extremely smooth and treated to enhance direct, covalent bonding, even at room temperature and without application of pressure beyond contact. In some hybrid bonded structures, nonconductive field regions of the elements can be directly bonded to one another, and corresponding conductive contact structures can be directly bonded to one another.

For example, a semiconductor element can be mounted to a carrier, such as a package substrate, an interposer, a reconstituted wafer or element, a flat panel, a glass, etc. A semiconductor element can be stacked on top of the semiconductor element (e.g., a first integrated device die can be stacked on a second integrated device die). Each of the semiconductor elements can have conductive pads for mechanically and electrically bonding the semiconductor elements to one another with the conductive pads mechanically and electrically bonded to one another.

SUMMARY

Certain implementations described herein provide a structure comprising a first substrate comprising a first layer having at least one electrically conductive first portion and at least one electrically insulative second portion. The structure further comprises a second substrate comprising a second layer having at least one electrically conductive third portion and at least one electrically insulative fourth portion. The structure further comprises an interface layer between the first layer and the second layer. The interface layer comprises at least one electrically conductive oxide material. The at least one electrically conductive oxide material comprises at least one first region between and in electrical communication with the at least one electrically conductive first portion and the at least one electrically conductive third portion. The at least one electrically conductive oxide material further comprises at least one second region between the at least one electrically insulative second portion and the at least one electrically insulative fourth portion. The at least one second region is electrically isolated from the at least one first region.

Certain implementations described herein provide a structure comprising a first substrate having a first conductive feature comprising a first region of a first deposited electrically conductive oxide material. The structure further comprises a second substrate having a second conductive feature directly bonded to the first conductive feature.

Certain implementations described herein provide a method comprising providing a first substrate and a second substrate each comprising one or more electrically conductive surface portions and one or more electrically insulative surface portions. At least one of the first substrate and the second substrate further comprises an electrically conductive oxide layer having a first region over and in electrical communication with the one or more electrically conductive surface portions and a second region over the one or more electrically insulative surface portions. The second region is electrically isolated from the first region. The method further comprises directly bonding the first substrate and the second substrate with one another without an intervening adhesive. Said directly bonding the first substrate and the second substrate comprises contacting the first substrate and the second substrate with one another with the electrically conductive oxide layer therebetween.

Certain implementations described herein provide a method comprising providing a first substrate having a first patterned conductive contact feature. The first patterned conductive contact feature comprises a first region of a first electrically conductive oxide material. The method further comprises providing a second substrate having a second conductive contact feature. The method further comprises directly bonding the first conductive contact feature to the second conductive contact feature.

Certain implementations described herein provide a method comprising providing a first patterned conductive contact feature in a first substrate. The method further comprises providing a second patterned conductive contact feature in a second substrate. The method further comprises directly bonding the first patterned conductive contact feature to the second patterned conductive contact feature. The first substrate and the second substrate are not activated after the first patterned conductive contact feature is patterned and prior to the directly bonding.

Certain implementations described herein provide a method comprising providing a first patterned conductive contact feature in a first substrate. The method further comprises providing a second patterned conductive contact feature in a second substrate. The method further comprises directly bonding the first patterned conductive contact feature to the second patterned conductive contact feature. The first substrate is not planarized after the first conductive contact feature is patterned and before the directly bonding.

Certain implementations described herein provide a structure comprising a first substrate comprising a first layer comprising dielectric oxide portions and electrically conductive portions, a second substrate comprising a second layer comprising dielectric oxide portions and electrically conductive portions, and an interface layer between the first layer and the second layer. The interface layer comprises at least one electrically conductive oxide material and comprising first portions between the dielectric oxide portions of the first and second layers and second portions between the electrically conductive portions of the first and second layers, the first portions of the interface layer electrically isolated from the second portions of the interface layer.

Certain implementations described herein provide a method comprising providing a first element comprising a first surface layer comprising dielectric oxide portions and electrically conductive portions. The method further comprises providing a second element comprising a second surface layer comprising dielectric oxide portions and electrically conductive portions. The method further comprises depositing an electrically conductive oxide layer over at least one of the first surface layer and the second surface layer. The deposited layer comprises first portions over the dielectric oxide portions of at least one of the first surface layer and the second surface layers, and the deposited layer further comprises second portions over the electrically conductive portions of at least one of the first surface layer and the second surface layer. The first portions of the deposited layer are electrically isolated from the second portions of the deposited layer. The method further comprises directly bonding the first element and the second element with one another without an intervening adhesive. The directly bonding comprises bonding the first and second surface layers together with the electrically conductive oxide layer therebetween.

Certain implementations described herein provide a method comprising providing a first substrate having a first conductive contact feature. The first conductive contact feature comprises a first region of a first deposited electrically conductive oxide material. The method further comprises providing a second substrate having a second conductive contact feature. The method further comprises directly bonding the first conductive contact feature to the second conductive contact feature.

BRIEF DESCRIPTION OF THE DRAWINGS

Specific implementations will now be described with reference to the following drawings, which are provided by way of example, and not limitation.

FIGS. 2A and 2B schematically illustrate two cross-sectional views of an example structure in accordance with certain implementations described herein.

FIGS. 2C and 2D schematically illustrate cross-sectional views of other example structures in accordance with certain implementations described herein.

DETAILED DESCRIPTION

Figure 1A:
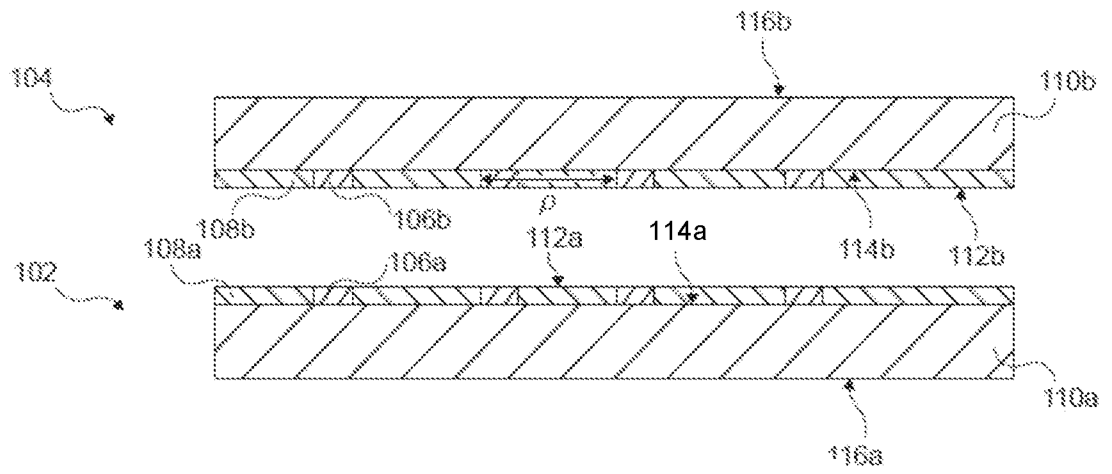
FIG. 1A is a schematic cross-sectional side view of two elements prior to bonding in accordance with certain implementations described herein.

Various embodiments disclosed herein relate to directly bonded structures in which two or more elements can be directly bonded to one another without an intervening adhesive. Such processes and structures are referred to herein as "direct bonding" processes or "directly bonded" structures. Direct bonding can involve bonding of one material on one element and one material on the other element (also referred to as "uniform" direct bond herein), where the materials on the different elements need not be the same, without traditional adhesive materials. Direct bonding can also involve bonding of multiple materials on one element to multiple materials on the other element (e.g., hybrid bonding).

In some implementations (not illustrated), each bonding layer has one material. In these uniform direct bonding processes, only one material on each element is directly bonded. Example uniform direct bonding processes include the ZIBOND® techniques commercially available from Adeia of San Jose, CA. The materials of opposing bonding layers on the different elements can be the same or different, and may comprise elemental or compound materials. For example, in some embodiments, nonconductive bonding layers can be blanket deposited over the base substrate portions without being patterned with conductive features (e.g., without pads). In other embodiments, the bonding layers can be patterned on one or both elements, and can be the same or different from one another, but one material from each element is directly bonded without adhesive across surfaces of the elements (or across the surface of the smaller element if the elements are differently-sized). In another implementation of uniform direct bonding, one or both of the nonconductive bonding layers may include one or more conductive features, but the conductive features are not involved in the bonding. For example, in some implementations, opposing nonconductive bonding layers can be uniformly directly bonded to one another, and through substrate vias (TSVs) can be subsequently formed through one element after bonding to provide electrical communication to the other element.

In various embodiments, the bonding layers 108*a* and/or 108*b* can comprise a non-conductive material such as a dielectric material or an undoped semiconductor material, such as undoped silicon, which may include native oxide. Suitable dielectric bonding surface or materials for direct bonding include but are not limited to inorganic dielectrics, such as silicon oxide, silicon nitride, or silicon oxynitride, or can include carbon, such as silicon carbide, silicon oxycarbonitride, low K dielectric materials, SiCOH dielectrics, silicon carbonitride or diamond-like carbon or a material comprising a diamond surface. Such carbon-containing ceramic materials can be considered inorganic, despite the inclusion of carbon. In some embodiments, the dielectric materials at the bonding surface do not comprise polymer materials, such as epoxy (e.g., epoxy adhesives, cured epoxies, or epoxy composites such as FR-4 materials), resin or molding materials.

In other embodiments, the bonding layers can comprise an electrically conductive material, such as a deposited conductive oxide material, e.g., indium tin oxide (ITO), as disclosed in U.S. Provisional Patent Application No. 63/524,564, filed Jun. 30, 2023, the entire contents of which is incorporated by reference herein in its entirety for providing examples of conductive bonding layers without shorting contacts through the interface.

In direct bonding, first and second elements can be directly bonded to one another without an adhesive, which is different from a deposition process and results in a structurally different interface compared to that produced by deposition. In one application, a width of the first element in the bonded structure is similar to a width of the second element. In some other embodiments, a width of the first element in the bonded structure is different from a width of the second element. The width or area of the larger element in the bonded structure may be at least 10% larger than the width or area of the smaller element. Further, the interface between directly bonded structures, unlike the interface beneath deposited layers, can include a defect region in which nanometer-scale voids (nanovoids) are present. The nanovoids may be formed due to activation of one or both of the bonding surfaces (e.g., exposure to a plasma, explained below).

The bond interface between non-conductive bonding surfaces can include a higher concentration of materials from the activation and/or last chemical treatment processes compared to the bulk of the bonding layers. For example, in embodiments that utilize a nitrogen plasma for activation, a nitrogen concentration peak can be formed at the bond interface. In some embodiments, the nitrogen concentration peak may be detectable using secondary ion mass spectroscopy (SIMS) techniques. In various embodiments, for example, a nitrogen termination treatment (e.g., exposing the bonding surface to a nitrogen-containing plasma) can replace OH groups of a hydrolyzed (OH-terminated) surface with $NH_2$ molecules, yielding a nitrogen-terminated surface. In embodiments that utilize an oxygen plasma for activation, an oxygen concentration peak can be formed at the bond interface between non-conductive bonding surfaces. In some embodiments, the bond interface can comprise silicon oxynitride, silicon oxycarbonitride, or silicon carbonitride. The direct bond can comprise a covalent bond, which is stronger than van Der Waals bonds. The bonding layers can also comprise polished surfaces that are planarized to a high degree of smoothness.

In direct bonding processes, such as uniform direct bonding and hybrid bonding, two elements are bonded together without an intervening adhesive. In non-direct bonding processes that utilize an adhesive, an intervening material is typically applied to one or both elements to effectuate a physical connection between the elements. For example, in some adhesive-based processes, a flowable adhesive (e.g., an organic adhesive, such as an epoxy), which can include conductive filler materials, can be applied to one or both elements and cured to form the physical (rather than chemical or covalent) connection between elements. Typical organic adhesives lack strong chemical or covalent bonds with either element. In such processes, the connections between the elements are weak and/or readily reversed, such as by reheating or defluxing.

By contrast, direct bonding processes join two elements by forming strong chemical bonds (e.g., covalent bonds) between opposing nonconductive materials. For example, in direct bonding processes between nonconductive materials, one or both nonconductive surfaces of the two elements are planarized and chemically prepared (e.g., activated and/or terminated) such that when the elements are brought into contact, strong chemical bonds (e.g., covalent bonds) are formed, which are stronger than Van der Waals or hydrogen bonds. In some implementations (e.g., between opposing dielectric surfaces, such as opposing silicon oxide surfaces), the chemical bonds can occur spontaneously at room temperature upon being brought into contact. In some implementations, the chemical bonds between opposing nonconductive materials can be strengthened after annealing the elements.

As noted above, hybrid bonding is a species of direct bonding in which both non-conductive features directly bond to non-conductive features, and conductive features directly bond to conductive features of the elements being bonded. The non-conductive bonding materials and interface can be as described above, while the conductive bond can be formed, for example, as a direct metal-to-metal connection. In conventional metal bonding processes, a fusible metal alloy (e.g., solder) can be provided between the conductors of two elements, heated to melt the alloy, and cooled to form the connection between the two elements. The resulting bond often evinces sharp interfaces with conductors from both elements, and is subject to reversal by reheating. By way of contrast, direct metal bonding as employed in hybrid bonding does not require melting or an intermediate fusible metal alloy, and can result in strong mechanical and electrical connections, often demonstrating interdiffusion of the bonded conductive features with grain growth across the bonding interface between the elements, even without the much higher temperatures and pressures of thermocompression bonding.

Figure 1B:
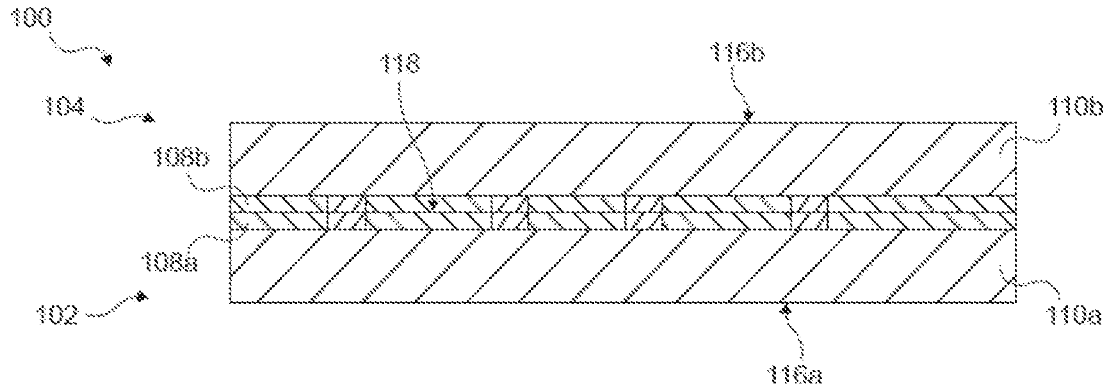
FIG. 1B is a schematic cross-sectional side view of the two elements of FIG. 1A after bonding in accordance with certain implementations described herein.

FIGS. 1A and 1B schematically illustrate cross-sectional side views of first and second elements 102, 104 prior to and after, respectively, a process for forming a directly bonded structure, and more particularly a hybrid bonded structure, according to some embodiments. In FIG. 1B, a bonded structure 100 comprises the first and second elements 102 and 104 that are directly bonded to one another at a bond interface 118 without an intervening adhesive. Conductive features 106*a* of a first element 102 may be electrically connected to corresponding conductive features 106*b* of a second element 104. In the illustrated hybrid bonded structure 100, the conductive features 106*a* are directly bonded to the corresponding conductive features 106*b* without intervening solder or conductive adhesive.

The conductive features 106*a* and 106*b* of the illustrated embodiment are embedded in, and can be considered part of, a first bonding layer 108*a* of the first element 102 and a second bonding layer 108*b* of the second element 104, respectively. Field regions of the bonding layers 108*a*, 108*b* extend between and partially or fully surround the conductive features 106*a*, 106*b*. The bonding layers 108*a*, 108*b* can comprise layers of non-conductive materials suitable for direct bonding, as described above, and the field regions are directly bonded to one another without an adhesive. The non-conductive bonding layers 108*a*, 108*b* can be disposed on respective front sides 114*a*, 114*b* of base substrate portions 110*a*, 110*b*.

The first and second elements 102, 104 can comprise microelectronic elements, such as semiconductor elements, including, for example, integrated device dies, wafers, passive devices, discrete active devices such as power switches, MEMS, etc. In some embodiments, the base substrate portion can comprise a device portion, such as a bulk semiconductor (e.g., silicon) portion of the elements 102, 104, and back-end-of-line (BEOL) interconnect layers over such semiconductor portions. The bonding layers 108*a*, 108*b* can be provided as part of such BEOL layers during device fabrication, as part of redistribution layers (RDL), or as specific bonding layers added to existing devices, with bond pads extending from underlying contacts. Active devices and/or circuitry can be patterned and/or otherwise disposed in or on the base substrate portions 110*a*, 110*b*, and can electrically communicate with at least some of the conductive features 106*a*, 106*b*. Active devices and/or circuitry can be disposed at or near the front sides 114*a*, 114*b* of the base substrate portions 110*a*, 110*b*, and/or at or near opposite backsides 116*a*, 116*b* of the base substrate portions 110*a*, 110*b*. In other embodiments, the base substrate portions 110*a*, 110*b* may not include active circuitry, but may instead comprise dummy substrates, passive interposers, passive optical elements (e.g., glass substrates, gratings, lenses), etc. The bonding layers 108*a*, 108*b* are shown as being provided on the front sides of the elements, but similar bonding layers can be additionally or alternatively provided on the back sides of the elements.

In some embodiments, the base substrate portions 110*a*, 110*b* can have significantly different coefficients of thermal expansion (CTEs), and bonding elements that include such different based substrate portions can form a heterogenous bonded structure. The CTE difference between the base substrate portions 110*a* and 110*b*, and particularly between bulk semiconductor (typically single crystal) portions of the base substrate portions 110*a*, 110*b*, can be greater than 5 ppm/° C. or greater than 10 ppm/° C. For example, the CTE difference between the base substrate portions 110*a* and 110*b* can be in a range of 5 ppm/° C. to 100 ppm/° C., 5 ppm/° C. to 40 ppm/° C., 10 ppm/° C. to 100 ppm/° C., or 10 ppm/° C. to 40 ppm/° C.

In some embodiments, one of the base substrate portions 110*a*, 110*b* can comprise optoelectronic single crystal materials, including perovskite materials, that are useful for optical piezoelectric or pyroelectric applications, and the other of the base substrate portions 110*a*, 110*b* comprises a more conventional substrate material. For example, one of the base substrate portions 110*a*, 110*b* comprises lithium tantalate (LiTaO3) or lithium niobate (LiNbO3), and the other one of the base substrate portions 110*a*, 110*b* comprises silicon (Si), quartz, fused silica glass, sapphire, or a glass. In other embodiments, one of the base substrate portions 110*a*, 110*b* comprises a III-V single semiconductor material, such as gallium arsenide (GaAs) or gallium nitride (GaN), and the other one of the base substrate portions 110*a*, 110*b* can comprise a non-III-V semiconductor material, such as silicon (Si), or can comprise other materials with similar CTE, such as quartz, fused silica glass, sapphire, or a glass. In still other embodiments, one of the base substrate portions 110*a*, 110*b* comprises a semiconductor material and the other of the base substrate portions 110*a*, 110*b* comprises a packaging material, such as a glass, organic or ceramic substrate.

In some arrangements, the first element 102 can comprise a singulated element, such as a singulated integrated device die. In other arrangements, the first element 102 can comprise a carrier or substrate (e.g., a semiconductor wafer) that includes a plurality (e.g., tens, hundreds, or more) of device regions that, when singulated, forms a plurality of integrated device dies, though in other embodiments such a carrier can be a package substrate or a passive or active interposer. Similarly, the second element 104 can comprise a singulated element, such as a singulated integrated device die. In other arrangements, the second element 104 can comprise a carrier or substrate (e.g., a semiconductor wafer). The embodiments disclosed herein can accordingly apply to wafer-to-wafer (W2W), die-to-die (D2D), or die-to-wafer (D2W) bonding processes. In W2W processes, two or more wafers can be directly bonded to one another (e.g., direct hybrid bonded) and singulated using a suitable singulation process. After singulation, side edges of the singulated structure (e.g., the side edges of the two bonded elements) can be substantially flush (substantially aligned x-y dimensions) and/or the edges of the bonding interfaces for both bonded and singulated elements can be coextensive, and may include markings indicative of the common singulation process for the bonded structure (e.g., saw markings if a saw singulation process is used).

While only two elements 102, 104 are shown, any suitable number of elements can be stacked in the bonded structure 100. For example, a third element (not shown) can be stacked on the second element 104, a fourth element (not shown) can be stacked on the third element, and so forth. In such implementations, through substrate vias (TSVs) can be formed to provide vertical electrical communication between and/or among the vertically-stacked elements. Additionally or alternatively, one or more additional elements (not shown) can be stacked laterally adjacent one another along the first element 102. In some embodiments, a laterally stacked additional element may be smaller than the second element. In some embodiments, the bonded structure can be encapsulated with an insulating material, such as an inorganic dielectric (e.g., silicon oxide, silicon nitride, silicon oxynitrocarbide, etc.). One or more insulating layers can be provided over the bonded structure. For example, in some implementations, a first insulating layer can be conformally deposited over the bonded structure, and a second insulating layer (which may include be the same material as the first insulating layer, or a different material) can be provided over the first insulating layer.

To effectuate direct bonding between the bonding layers 108*a*, 108*b*, the bonding layers 108*a*, 108*b* can be prepared for direct bonding. Non-conductive bonding surfaces 112*a*, 112*b* at the upper or exterior surfaces of the bonding layers 108*a*, 108*b* can be prepared for direct bonding by polishing, for example, by chemical mechanical polishing (CMP). The roughness of the polished bonding surfaces 112*a*, 112*b* can be less than 30 Å rms. For example, the roughness of the bonding surfaces 112*a* and 112*b* can be in a range of about 0.1 Å rms to 15 Å rms, 0.5 Å rms to 10 Å rms, or 1 Å rms to 5 Å rms. Polishing can also be tuned to leave the conductive features 106*a*, 106*b* recessed relative to the field regions of the bonding layers 108*a*, 108*b*.

Preparation for direct bonding can also include cleaning and exposing one or both of the bonding surfaces 112*a*, 112*b* to a plasma and/or etchants to activate at least one of the surfaces 112*a*, 112*b*. In some embodiments, one or both of the surfaces 112*a*, 112*b* can be terminated with a species after activation or during activation (e.g., during the plasma and/or etch processes). Without being limited by theory, in some embodiments, the activation process can be performed to break chemical bonds at the bonding surface(s) 112*a*, 112*b*, and the termination process can provide additional chemical species at the bonding surface(s) 112*a*, 112*b* that alters the chemical bond and/or improves the bonding energy during direct bonding. In some embodiments, the activation and termination are provided in the same step, e.g., a plasma to activate and terminate the surface(s) 112*a*, 112*b*. In other embodiments, one or both of the bonding surfaces 112*a*, 112*b* can be terminated in a separate treatment to provide the additional species for direct bonding. In various embodiments, the terminating species can comprise nitrogen. For example, in some embodiments, the bonding surface(s) 112*a*, 112*b* can be exposed to a nitrogen-containing plasma. Other terminating species can be suitable for improving bonding energy, depending upon the materials of the bonding surfaces 112*a*, 112*b*. Further, in some embodiments, the bonding surface(s) 112*a*, 112*b* can be exposed to fluorine. For example, there may be one or multiple fluorine concentration peaks at or near a bond interface 118 between the first and second elements 102, 104. Typically, fluorine concentration peaks occur at interfaces between material layers. Additional examples of activation and/or termination treatments may be found in U.S. Pat. No. 9,391,143 at Col. 5, line 55 to Col. 7, line 3; Col. 8, line 52 to Col. 9, line 45; Col. 10, lines 24-36; Col. 11, lines 24-32, 42-47, 52-55, and 60-64; Col. 12, lines 3-14, 31-33, and 55-67; Col. 14, lines 38-40 and 44-50; and 10,434,749 at Col. 4, lines 41-50; Col. 5, lines 7-22, 39, 55-61; Col. 8, lines 25-31, 35-40, and 49-56; and Col. 12, lines 46-61, the activation and termination teachings of which are incorporated by reference herein.

Thus, in the directly bonded structure 100, the bond interface 118 between two non-conductive materials (e.g., the bonding layers 108*a*, 108*b*) can comprise a very smooth interface with higher nitrogen (or other terminating species) content and/or fluorine concentration peaks at the bond interface 118. In some embodiments, the nitrogen and/or fluorine concentration peaks may be detected using various types of inspection techniques, such as SIMS techniques. The polished bonding surfaces 112*a* and 112*b* can be slightly rougher (e.g., about 1 Å rms to 30 Å rms, 3 Å rms to 20 Å rms, or possibly rougher) after an activation process. In some embodiments, activation and/or termination can result in slightly smoother surfaces prior to bonding, such as where a plasma treatment preferentially erodes high points on the bonding surface.

The non-conductive bonding layers 108*a* and 108*b* can be directly bonded to one another without an adhesive. In some embodiments, the elements 102, 104 are brought together at room temperature, without the need for application of a voltage, and without the need for application of external pressure or force beyond that used to initiate contact between the two elements 102, 104. Contact alone can cause direct bonding between the non-conductive surfaces of the bonding layers 108*a*, 108*b* (e.g., covalent dielectric bonding). Subsequent annealing of the bonded structure 100 can cause the conductive features 106*a*, 106*b* to directly bond.

In some embodiments, prior to direct bonding, the conductive features 106*a*, 106*b* are recessed relative to the surrounding field regions, such that a total gap between opposing contacts after dielectric bonding and prior to anneal is less than 15 nm, or less than 10 nm. Because the recess depths for the conductive features 106*a* and 106*b* can vary across each element, due to process variation, the noted gap can represent a maximum or an average gap between corresponding conductive features 106*a*, 106*b* of two joined elements (prior to anneal). Upon annealing, the conductive features 106*a* and 106*b* can expand and contact one another to form a metal-to-metal direct bond.

During annealing, the conductive features 106*a*, 106*b* (e.g., metallic material) can expand while the direct bonds between surrounding non-conductive materials of the bonding layers 108*a*, 108*b* resist separation of the elements, such that the thermal expansion increases the internal contact pressure between the opposing conductive features. Annealing can also cause metallic grain growth across the bonding interface, such that grains from one element migrate across the bonding interface at least partially into the other element, and vice versa. Thus, in some hybrid bonding embodiments, opposing conductive materials are joined without heating above the conductive materials' melting temperature, such that bonds can form with lower anneal temperatures compared to soldering or thermocompression bonding.

In various embodiments, the conductive features 106*a*, 106*b* can comprise discrete pads, contacts, electrodes, or traces at least partially embedded in the non-conductive field regions of the bonding layers 108*a*, 108*b*. In some embodiments, the conductive features 106*a*, 106*b* can comprise exposed contact surfaces of TSVs (e.g., through silicon vias).

As noted above, in some embodiments, in the elements 102, 104 of FIG. 1A prior to direct bonding, portions of the respective conductive features 106*a* and 106*b* can be recessed below the non-conductive bonding surfaces 112*a* and 112*b*, for example, recessed by less than 30 nm, less than 20 nm, less than 15 nm, or less than 10 nm, for example, recessed in a range of 2 nm to 20 nm, or in a range of 4 nm to 10 nm. Due to process variation, both dielectric thickness and conductor recess depths can vary across an element. Accordingly, the above recess depth ranges may apply to individual conductive features 106*a*, 106*b* or to average depths of the recesses relative to local non-conductive field regions. Even for an individual conductive feature 106*a*, 106*b*, the vertical recess can vary across the feature, and so can be measured at or near the lateral middle or center of the cavity in which a given conductive feature 106*a*, 106*b* is formed, or can be measured at the sides of the cavity.

Beneficially, the use of hybrid bonding techniques (such as Direct Bond Interconnect, or DBIR, techniques commercially available from Adeia of San Jose, CA) can enable high density of connections between conductive features 106*a*, 106*b* across the direct bond interface 118 (e.g., small or fine pitches for regular arrays).

In some embodiments, a pitch p of the conductive features 106*a*, 106*b*, such as conductive traces embedded in the bonding surface of one of the bonded elements, may be less than 40 μm, less than 20 μm, less than 10 μm, less than 5 μm, less than 2 μm, or even less than 1 μm. For some applications, the ratio of the pitch of the conductive features 106*a* and 106*b* to one of the lateral dimensions (e.g., a diameter) of the bonding pad is less than is less than 20, or less than 10, or less than 5, or less than 3 and sometimes desirably less than 2. In various embodiments, the conductive features 106*a* and 106*b* and/or traces can comprise copper or copper alloys, although other metals may be suitable, such as nickel, aluminum, or alloys thereof. The conductive features disclosed herein, such as the conductive features 106*a* and 106*b*, can comprise fine-grain metal (e.g., a fine-grain copper). Further, a major lateral dimension (e.g., a pad diameter) can be small as well, e.g., in a range of about 0.25 μm to 30 μm, in a range of about 0.25 μm to 5 μm, or in a range of about 0.5 μm to 5 μm.

For hybrid bonded elements 102, 104, as shown, the orientations of one or more conductive features 106*a*, 106*b* from opposite elements can be opposite to one another. As is known in the art, conductive features in general can be formed with close to vertical sidewalls, particularly where directional reactive ion etching (RIE) defines the conductor sidewalls either directly though etching the conductive material or indirectly through etching surrounding insulators in damascene processes. However, some slight taper to the conductor sidewalls can be present, wherein the conductor becomes narrower farther away from the surface initially exposed to the etch. The taper can be even more pronounced when the conductive sidewall is defined directly or indirectly with isotropic wet or dry etching. In the illustrated embodiment, at least one conductive feature 106*b* in the bonding layer 108*b* (and/or at least one internal conductive feature, such as a BEOL feature) of the upper element 104 may be tapered or narrowed upwardly, away from the bonding surface 112*b*. By way of contrast, at least one conductive feature 106*a* in the bonding layer 108*a* (and/or at least one internal conductive feature, such as a BEOL feature) of the lower element 102 may be tapered or narrowed downwardly, away from the bonding surface 112*a*. Similarly, any bonding layers (not shown) on the backsides 116*a*, 116*b* of the elements 102, 104 may taper or narrow away from the backsides, with an opposite taper orientation relative to front side conductive features 106*a*, 106*b* of the same element.

As described above, in an anneal phase of hybrid bonding, the conductive features 106*a*, 106*b* can expand and contact one another to form a metal-to-metal direct bond. In some embodiments, the materials of the conductive features 106*a*, 106*b* of opposite elements 102, 104 can interdiffuse during the annealing process. In some embodiments, metal grains grow into each other across the bond interface 118. In some embodiments, the metal is or includes copper, which can have grains oriented along the 111 crystal plane for improved copper diffusion across the bond interface 118. In some embodiments, the conductive features 106*a* and 106*b* may include nanotwinned copper grain structure, which can aid in merging the conductive features during anneal. There is substantially no gap between the non-conductive bonding layers 108*a* and 108*b* at or near the bonded conductive features 106*a* and 106*b*. In some embodiments, a barrier layer may be provided under and/or laterally surrounding the conductive features 106*a* and 106*b* (e.g., which may include copper). In other embodiments, however, there may be no barrier layer under the conductive features 106*a* and 106*b*.

Certain implementations disclosed herein relate to optoelectronic devices that include directly bonded contacts comprising optically transparent or optically semi-transparent electrically conducting material (referred to herein collectively as transparent conductors or TCs) instead of metal direct bonded contacts. For example, the optoelectronic devices can include optical elements or devices (e.g., photodiodes; light emitting diodes (LEDs)); quantum dot light emitting diodes (QLEDs); lasers; vertical-cavity surface-emitting lasers (VCSELs); transparency control pixels; liquid crystal pixels; adaptive optics; solar cells; waveguides; spatial light modulators; diode lasers; electrochromic devices) that are stacked on or bonded to one another to form a bonded structure. The TCs on separate substrates can be planarized and the planarized surfaces of the substrates can be placed in contact with one another, as described herein, to form the bonded structures.

In certain implementations, the optoelectronic devices described herein are configured to be used in various contexts which are area-limited (e.g., displays for virtual reality (VR) or augmented reality (AR) applications; multijunction solar cells) or other designs comprising an optoelectronic (e.g., electro-optical) element within a stack of other optical elements, beneficially utilizing the TCs for providing electrical connection between electrical elements while not appreciably blocking light.

As used herein, the term "optically transparent" includes but is not limited to optically translucent, optically semi-transparent, and/or having an optical transmittance of at least 50% (e.g., at least 60%; at least 75%; at least 88%; greater than or equal to 95%) at optical wavelengths in a predetermined range. For example, the predetermined range for optically transparent components (e.g., elements; substrates; layers; devices; features) can be visible wavelengths (e.g., 390 nanometers to 750 nanometers; 400 nanometers to 700 nanometers), ultraviolet wavelengths (e.g., 100 nanometers to 400 nanometers), infrared wavelengths (e.g., 800 nanometers to 1 millimeter), and/or short-wave infrared (SWIR) wavelengths (e.g., 1400 nanometers to 3000 nanometers).

As described herein, some electrically conductive oxides (e.g., indium tin oxide or ITO) or nitrides have the ability to self-bond at modest temperatures (e.g., in a range of 75° C. to 400° C.; in a range of 120° C. to 300° C.; in a range of 150° C. to 300° C.). In certain implementations, use of electrically conductive oxide or nitride layers can simplify processes for bonding (e.g., blanket wafer and hybrid bonding surfaces) by omitting one or more other processing steps (e.g., planarization and/or surface activation). For example, the electrically conductive oxide or nitride layers can be self-leveled if planarized before patterning. In conjunction with certain layout structures, such electrically conductive oxide or nitride layers can be used to bond multiple input/output components with a single material interface. For example, ITO can be used to bond two substrates without a surface activation step, and in certain implementations, without a surface planarization (e.g., chemical-mechanical polishing or CMP) step. The electrically conductive oxide or nitride layers can also allow bonding at modest temperatures (e.g., less than 300° C.) and can be used for surface mounting. In view of the electrical conductivity, such layers can provide electromagnetic shielding for other components of the electronic packages. In addition, because certain such materials are substantially optically transparent, they can be used for bonding optoelectronic applications, as well as in other structures where photon transmission is not a factor.

Figure 3A:
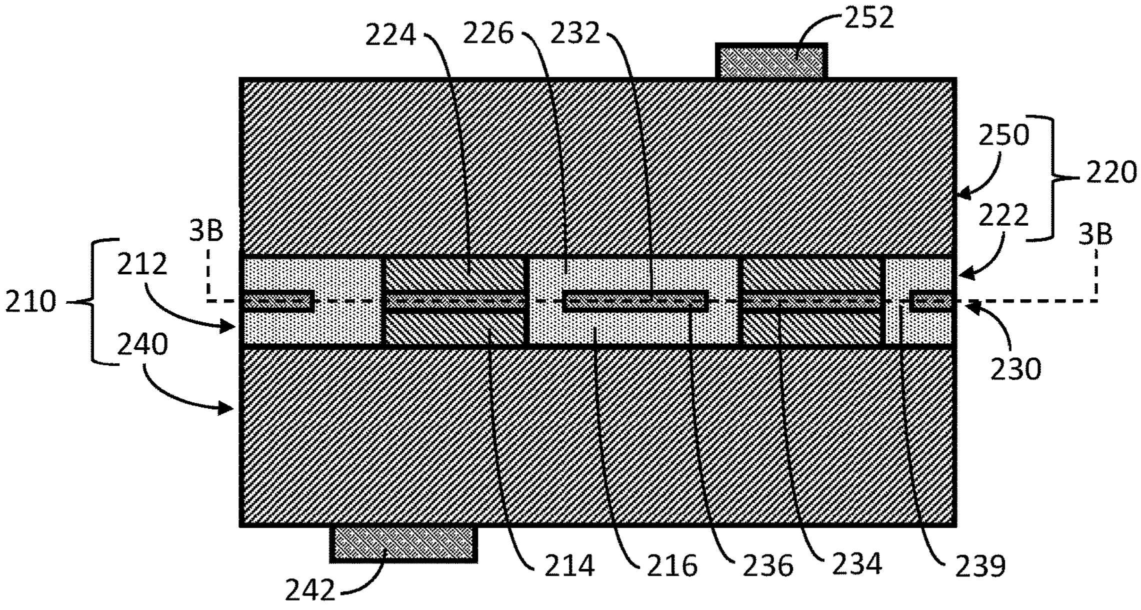
FIGS. 3A and 3B schematically illustrate two cross-sectional views of another example structure in accordance with certain implementations described herein.
Figure 3B:
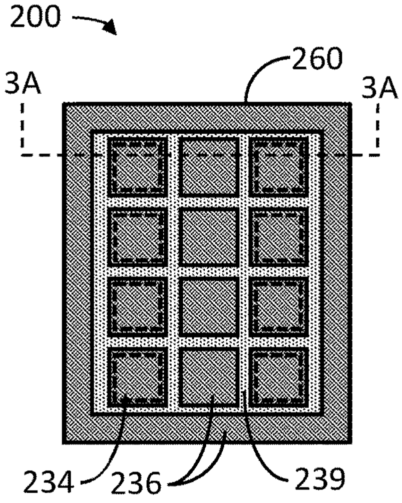

FIGS. 2A and 2B schematically illustrate two cross-sectional views of an example structure 200 in accordance with certain implementations described herein, and FIGS. 3A and 3B schematically illustrate two cross-sectional views of another example structure 200 in accordance with certain implementations described herein. The cross-sectional views of FIGS. 2A and 3A are in a first plane and the cross-sectional views of FIGS. 2B and 3B are in a second plane (e.g., a cross-sectional plan view) substantially perpendicular to the first plane of FIGS. 2A and 3A, respectively. The structure 200 comprises a first substrate 210 (e.g., first element 102) comprising a first layer 212 having at least one electrically conductive first portion 214 (e.g., conductive feature 106*a*) and at least one electrically insulative second portion 216. The structure 200 further comprises a second substrate 220 (e.g., second element 104) comprising a second layer 222 having at least one electrically conductive third portion 224 (e.g., conductive feature 106*b*) and at least one electrically insulative fourth portion 226. The structure 200 further comprises an interface layer 230 between the first layer 212 and the second layer 222 (e.g., formed by direct bonding of two opposing layers of at least one electrically conductive oxide material 232). The interface layer 230 comprises at least one electrically conductive oxide material 232. The at least one electrically conductive oxide material 232 comprises at least one first region 234 between and in electrical communication with the at least one electrically conductive first portion 214 and the at least one electrically conductive third portion 224. The at least one electrically conductive oxide material 232 further comprises at least one second region 236 between the at least one electrically insulative second portion 216 and the at least one electrically insulative fourth portion 226.

In certain implementations, the first substrate 210 comprises at least one first device 240 and the second substrate 220 comprises at least one second device 250. The at least one first device 240 and/or the at least one second device 250 can be optically transparent (e.g., optoelectronic device; optoelectronic element; electro-optical element; solar cell) or can be optically non-transparent (e.g., opaque). The at least one first device 240 and/or the at least one second device 250 can further comprise electrical conduits (e.g., optically transparent; non-optically transparent). In certain implementations, the first substrate 210 comprises at least one electrical contact 242 (e.g., a large lateral area contact on a backside 116*a* of the corresponding device portion 110*a*) in electrical communication with the at least one first device 240 and the second substrate 220 comprises at least one electrical contact 252 (e.g., on a backside 116*b* of the corresponding device portion 110*b*) in electrical communication with the at least one second device 250. The electrical contacts 242, 252 can be configured to transmit electrical signals to and/or from the first and/or second devices 240, 250. Example materials for the electrical contacts 242, 252 include but are not limited to copper or copper alloys, although other metals and alloys may be suitable. In addition, the electrical contacts 242, 252 can comprise additional electrically conductive layers between the copper and the corresponding at least one first and/or second device 240, 250. In certain implementations, at least one of the electrical contact 242, 252 comprises an electro-optical (EO) contact comprising a transparent and electrically conductive material (e.g., an electrically conductive oxide material as disclosed herein) that is in electrical and optical communication with the at least one first device 240 and the at least one second device 250, respectively, to transmit electrical and optical signals to and/or from the first and/or second devices 240, 250.

In certain implementations, the at least one electrically conductive first portion 214 and/or the at least one electrically conductive third portion 224 comprises at least one electrically conductive material, examples of which include, but are not limited to: copper; tungsten; cobalt; doped and undoped metal oxides; aluminum zinc oxide (AZO); indium tin oxide (ITO, $In_2O_3$); zinc oxide (ZnO); zinc tin oxide ($ZnSnO_3$, $Zn_2SnO_4$); indium-doped zinc oxide (IZO); indium oxide; cadmium tin oxide ($Cd_2SnO_4$); tin oxide ($SnO_2$); titanium dioxide ($TiO_2$); niobium-doped titanium dioxide (Nb—$TiO_2$); titanium nitride (TiN); tin nitride ($Sn_3N_4$); other metal nitrides (e.g., $A_3N_2$ where A=Mg, Zn, Sn); transition metal nitrides comprising a IIIB, IVB, or VB transition metal. In certain implementations, the first and/or third portions 214, 224 are optically transparent, while in certain other implementations, the first and/or third portions 214, 224 are optically non-transparent (e.g., opaque). Each of the first portions 214 and/or the third portions 224 can comprise a single layer or multiple layers. The first and third portions 214, 224 can comprise the same electrically conductive material or can comprise different electrically conductive materials (e.g., materials having different elemental constituents and/or different stoichiometries). The electrically conductive materials of the first and/or third portions 214, 224 can be different from the electrically conductive oxide material 232, and the bonding of the first and/or third portions 214, 224 with the interface layer 230 can comprise hybrid bonding.

In certain implementations, the at least one electrically insulative second portion 216 and/or the at least one electrically insulative fourth portion 226 comprises at least one dielectric material (e.g., an inorganic dielectric material), examples of which include, but are not limited to: semiconductor oxides; semiconductor nitrides; silicon oxide ($SiO_2$); silicon nitride ($SiN_x$, $Si_3N_4$); silicon oxycarbonitride ($SiO_xN_yC_z$); titanium oxide. In certain implementations, the second and/or fourth portions 216, 226 are optically transparent, while in certain other implementations, the second and/or fourth portions 216, 226 are optically non-transparent (e.g., opaque). Each of the second portions 216 and/or the fourth portions 226 can comprise a single layer or multiple layers. The second and fourth portions 216, 226 can comprise the same dielectric material or can comprise different dielectric materials (e.g., materials having different elemental constituents and/or different stoichiometries). The dielectric materials of the second and/or fourth portions 216, 226 are different from the electrically conductive oxide material 232, and the bonding of the second and/or fourth portions 216, 226 with the interface layer 230 can comprise hybrid bonding.

In certain implementations, the at least one electrically conductive oxide material 232 is selected from the group consisting of: indium tin oxide (ITO); zinc oxide (ZnO); indium-doped zinc oxide (IZO); tin oxide ($SnO_2$). In certain implementations, the at least one electrically conductive oxide material 232 is optically transparent, while in certain other implementations, the at least one electrically conductive oxide material 232 is optically non-transparent (e.g., opaque). As described herein, the at least one electrically conductive oxide material 232 can comprise a first electrically conductive oxide material 232*a* on the first layer 212 and a second electrically conductive oxide material 232*b* on the second layer 222, and the interface layer 230 can be formed by directly bonding the first electrically conductive oxide material 232*a* to the second electrically conductive oxide material 232*b*. In certain implementations, the interface layer 230 has a thickness in a range of 5 nm to 3 microns. In certain implementations, the resistivity of the electrically conductive oxide is in a range less than $500\times10^{-6}$ Ω-cm (e.g., $200\times10^{-6}$ Ω-cm to $40\times10^{-6}$ Ω-cm; $500\times10^{-6}$ Ω-cm to $20\times10^{-6}$ Ω-cm; in a range less than $120\times10^{-6}$ Ω-cm). In certain implementations, the optical transmission within the wavelength range of interest is greater than 40% (e.g., greater than 60%; greater than 80%).

In certain implementations, the interface layer 230 is patterned such that the at least one first region 234 is electrically isolated from the at least one second region 236. For example, as schematically illustrated by FIGS. 2A and 2B, the structure 200 further comprises gaps 238 between the at least one first region 234 and the at least one second region 236. In certain implementations, the gaps 238 comprise gas (e.g., air; nitrogen) and can be at atmospheric pressure, less than atmospheric pressure (e.g., vacuum pressure), or greater than atmospheric pressure. As schematically illustrated by FIG. 2A, the at least one electrically conductive oxide material 232 is not embedded within the at least one electrically insulative second portion 216 and/or the at least one electrically insulative fourth portion 226.

For another example, as schematically illustrated by FIGS. 3A and 3B, the interface layer 230 comprises at least one solid dielectric material 239 (e.g., silicon oxycarbonitride or $SiO_xN_yC_z$) between the at least one first region 234 and the at least one second region 236. The at least one solid dielectric material 239 can be different from the materials of the at least one electrically insulative second portion 216 and/or the at least one electrically insulative fourth portion 226, or the at least one solid dielectric material 239 can be the same as the material of the at least one electrically insulative second portion 216 and/or the at least one electrically insulative fourth portion 226. As schematically illustrated by FIG. 3A, the at least one conductive oxide material 232 is at least partially embedded (e.g., fully embedded)

within the at least one electrically insulative second portion 216 and/or the at least one electrically insulative fourth portion 226.

In the cross-sectional views of FIGS. 2B and 3B, the first regions 234 of the at least one electrically conductive oxide material 232 have dashed lines (denoting the underlying and overlying first and third portions 214, 224) to distinguish them from the second regions 236 of the at least one electrically conductive oxide material 232 (which have underlying and overlying second and fourth portions 216, 226). As shown in FIGS. 2B and 3B, the first regions 234 are electrically isolated from the second regions 236 and from one another (e.g., by the gaps 238 of FIG. 2A or by the at least one solid dielectric material 239 of FIG. 3A) such that the interface layer 230 does not electrically short the first portions 214 to one another and does not electrically short the third portions 224 to one another.

Figure 3C:
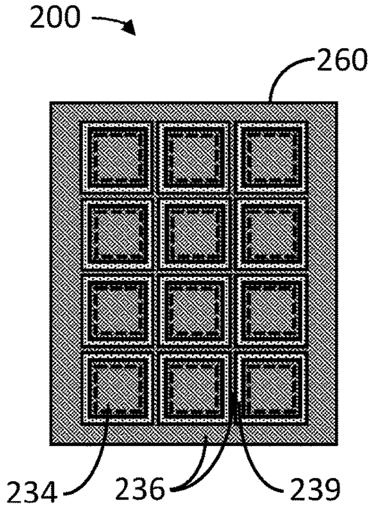
FIGS. 3C and 3D schematically illustrate cross-sectional views of other example structures in accordance with certain implementations described herein.
Figure 3D:
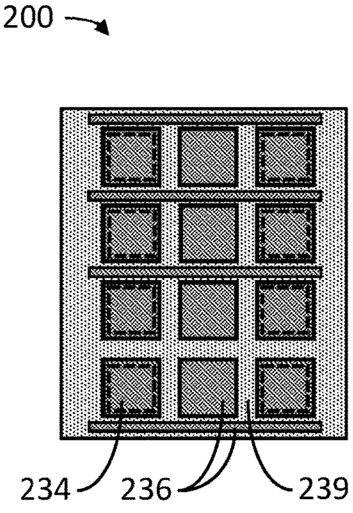

FIGS. 2C, 2D, 3C, and 3D schematically illustrate cross-sectional plan views of other example structures 200 in accordance with certain implementations described herein. Similar to FIGS. 2B and 3B, the cross-sectional views of FIGS. 2C, 2D, 3C, and 3D are in the second plane that is substantially perpendicular to the first plane of FIGS. 2A and 3A. As shown in FIGS. 2C, 2D, 3C, and 3D, at least some second regions 236 of the at least one electrically conductive oxide material 232 can be between at least some adjacent first regions 234 of the at least one electrically conductive oxide material 232 (e.g., between each adjacent pair of first regions 234 as shown in FIGS. 2C and 3C). As shown in FIGS. 2B, 2C, 3B, and 3C, a portion of the at least one electrically conductive oxide material 232 (e.g., the second regions 236) can be at a periphery 260 of the first and second substrates 210, 220. In certain implementations (see, e.g., FIGS. 2B, 2C, 3B, and 3C), the portion of the at least one electrically conductive oxide material 232 at the periphery 260 substantially surrounds (e.g., encircles) the first and/or second regions 234, 236 and can be configured to hermetically seal a second portion of the at least one electrically conductive oxide material 232 from an ambient environment (e.g., outside the periphery 260). As shown in FIGS. 2D and 3D, the at least one electrically conductive oxide material 232 can be spaced from the periphery 260 and/or does not substantially surround (e.g., encircle) the first and/or second regions 234, 236 or hermetically seal other portions of the at least one electrically conductive oxide material 232 from the ambient environment.

Figure 4A:
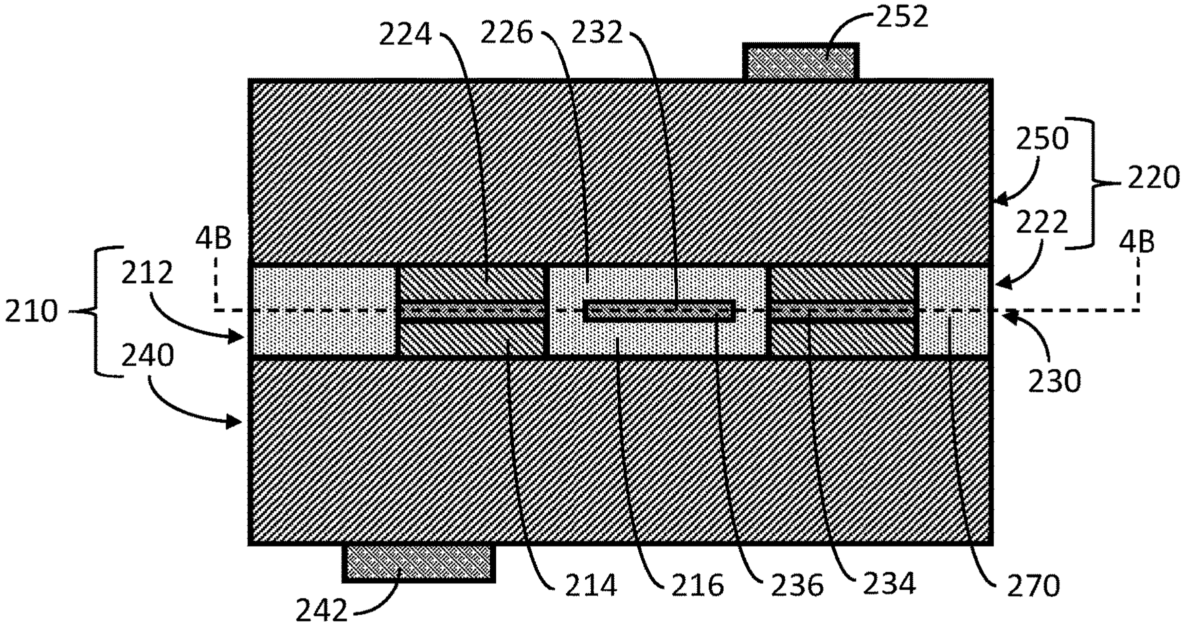
FIGS. 4A and 4B schematically illustrate two cross-sectional views of another example structure in accordance with certain implementations described herein.
Figure 4B:
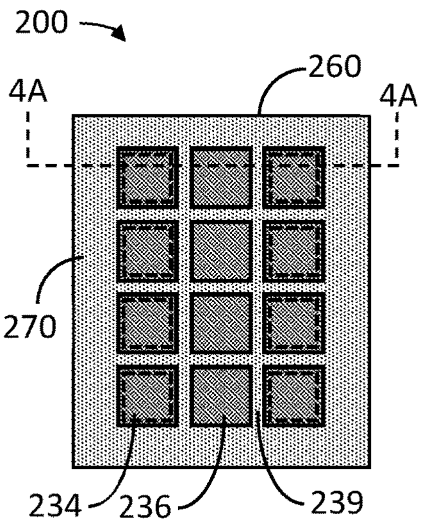
Figure 4C:
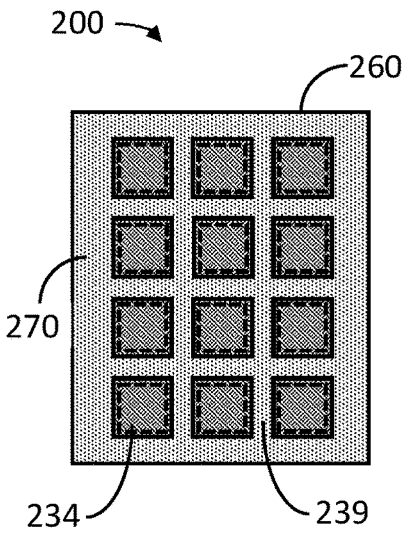
FIG. 4C schematically illustrates a cross-sectional view of another example structure in accordance with certain implementations described herein.

FIGS. 4A and 4B schematically illustrate two cross-sectional views of another example structure 200 in accordance with certain implementations described herein. The cross-sectional views of FIG. 4A is in a first plane and the cross-sectional views of FIG. 4B is in a second plane substantially perpendicular to the first plane of FIG. 4A. As schematically illustrated by FIG. 4A, the at least one conductive oxide material 232 is embedded within the at least one electrically insulative second portion 216 and/or the at least one electrically insulative fourth portion 226 (e.g., in the at least one solid dielectric material 270). FIG. 4C schematically illustrates a cross-sectional view of another example structure 200 in accordance with certain implementations described herein. Similar to FIG. 4B, the cross-sectional views of FIG. 4C is in the second plane that is substantially perpendicular to the first plane of FIG. 4A.

In certain implementations (e.g., as shown in FIGS. 4A-4C), a portion of the solid dielectric material 270 (e.g., silicon oxycarbonitride or $SiO_xN_yC_z$) of the first layer 212 is at a periphery 260 of the first and second substrates 210, 220. The solid dielectric material at the periphery 260 substantially surrounds (e.g., encircles) the at least one first region 234 and/or the at least one second region 236 and can be configured to hermetically seal the at least one first region 234 and/or the at least one second region 236 from the ambient environment (e.g., outside the periphery 260).

Figure 4D:
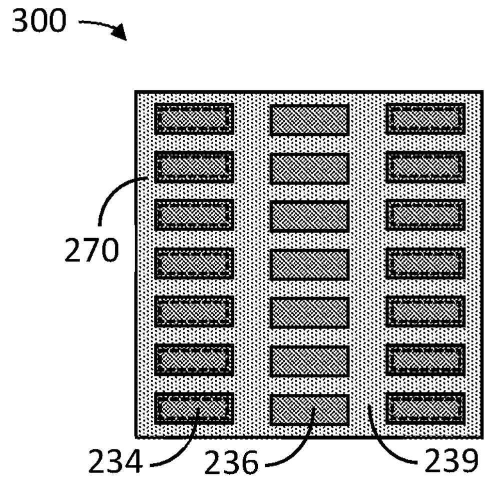
FIGS. 4D-4F schematically illustrate cross-sectional views of a section of an example die, an example first die layout, and an example second die layout in accordance with certain implementations described herein.
Figure 4E:
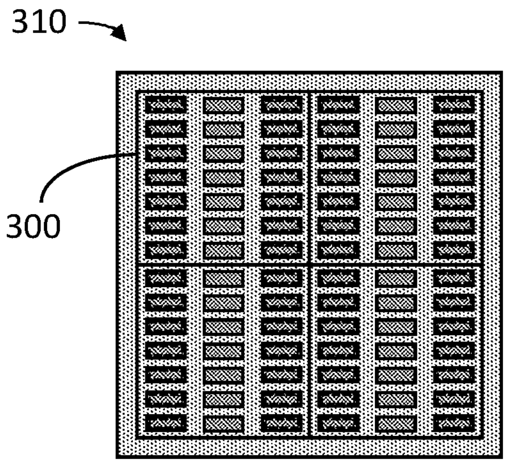
Figure 4F:
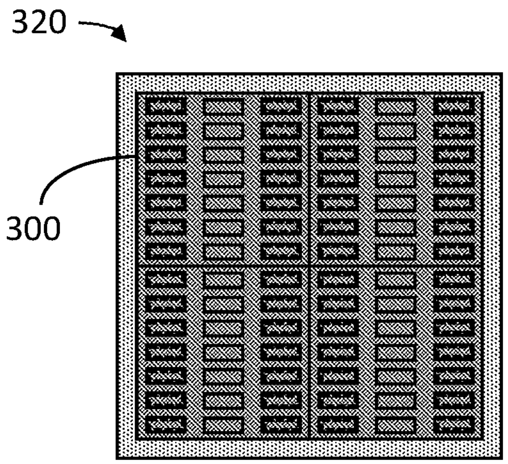

FIGS. 4D-4F schematically illustrate cross-sectional views of a section of an example die 300, an example first die layout 310, and an example second die layout 320 in accordance with certain implementations described herein. The cross-sectional views of FIGS. 4D-4F are in the second plane substantially perpendicular to the first plane of FIG. 4A. In FIGS. 4D-4F, the first portions 214 of the first layer 212 are embedded in the solid dielectric material 270 of the second portions 216 of the first layer 212, the third portions 224 of the second layer 222 are embedded in the solid dielectric material 270 of the fourth portions 226 of the second layer 222, with the first and second regions 234, 236 of the at least one electrically conductive oxide material 232 between the first layer 212 and the second layer 222. In the first die layout 310 of FIG. 4E, the at least one electrically conductive oxide material 232 is patterned such that the first portions 214 are electrically insulated from one another and the third portions 224 are electrically insulated from one another. In the second die layout 320 of FIG. 4F, the at least one electrically conductive oxide material 232 electrically connects multiple underlying first portions 214 to one another and/or electrically connects multiple overlying third portions 224 to one another. In the die 300, first die layout 310, and second die layout 320, the solid dielectric material 270 substantially surrounds (e.g., encircles) the at least one electrically conductive oxide material 232, hermetically sealing the first and second regions 234, 236 from the ambient environment (e.g., providing a hermetic seal ring). In certain implementations, the solid dielectric material 270 (e.g., silicon oxycarbonitride or $SiO_xN_yC_z$) provides higher hermeticity (e.g., lower gas leak rate) than would the at least one electrically conductive oxide material 232.

Figure 5:
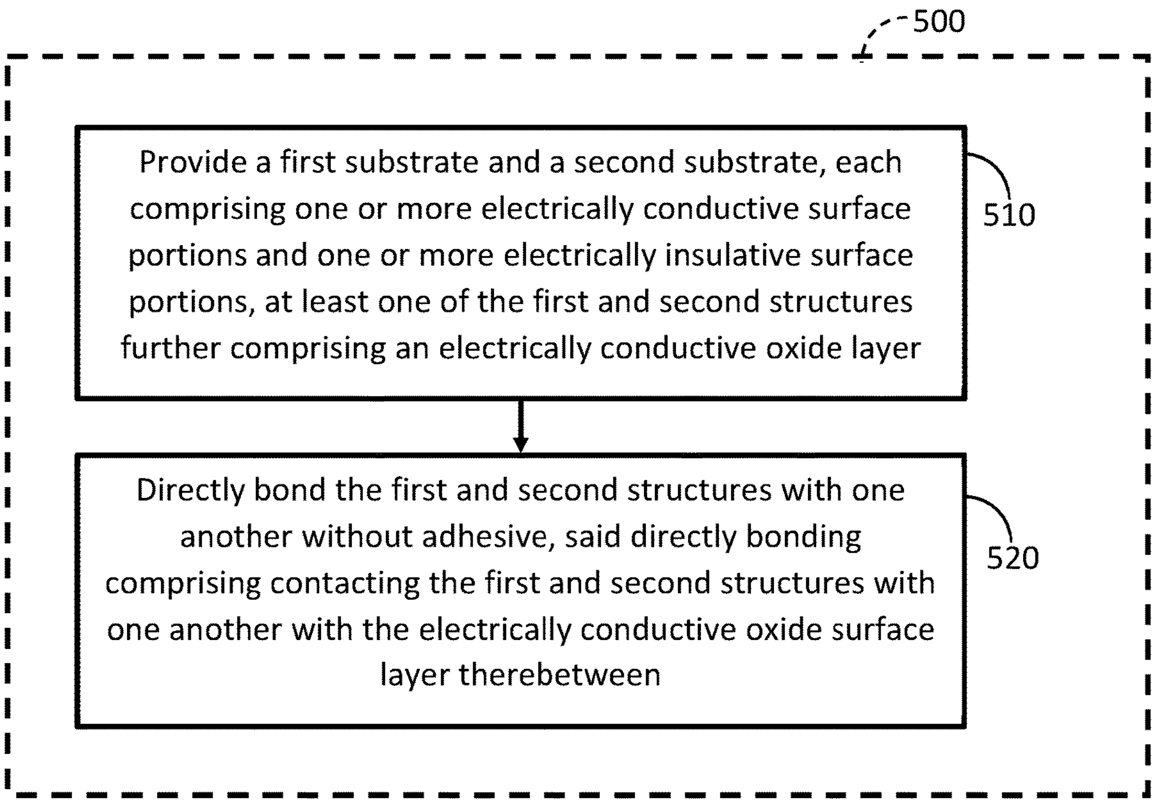
FIG. 5 is a flow diagram of an example method for forming a structure compatible with certain implementations described herein.
Figure 6A:
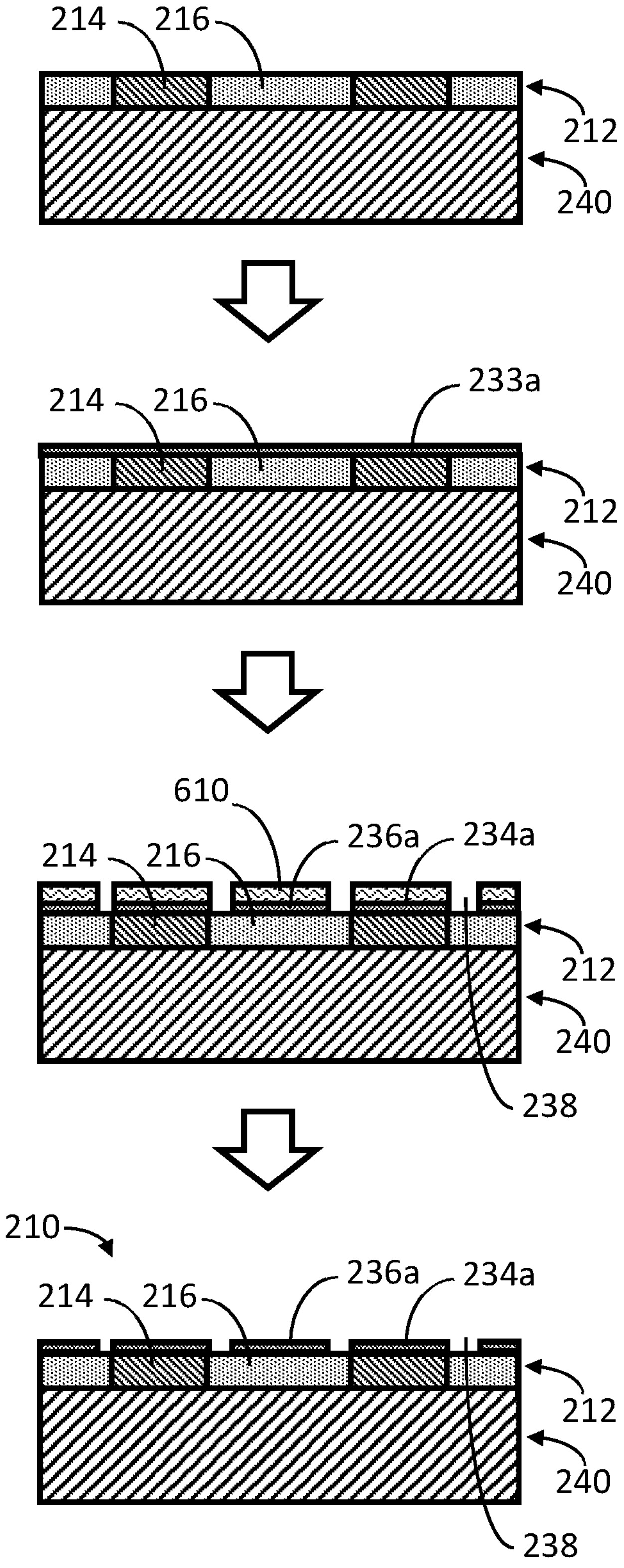
FIGS. 6A and 6B schematically illustrate the example method of FIG. 5 for forming the example structures of FIGS. 2A and 2B in accordance with certain implementations described herein.
Figure 6B:
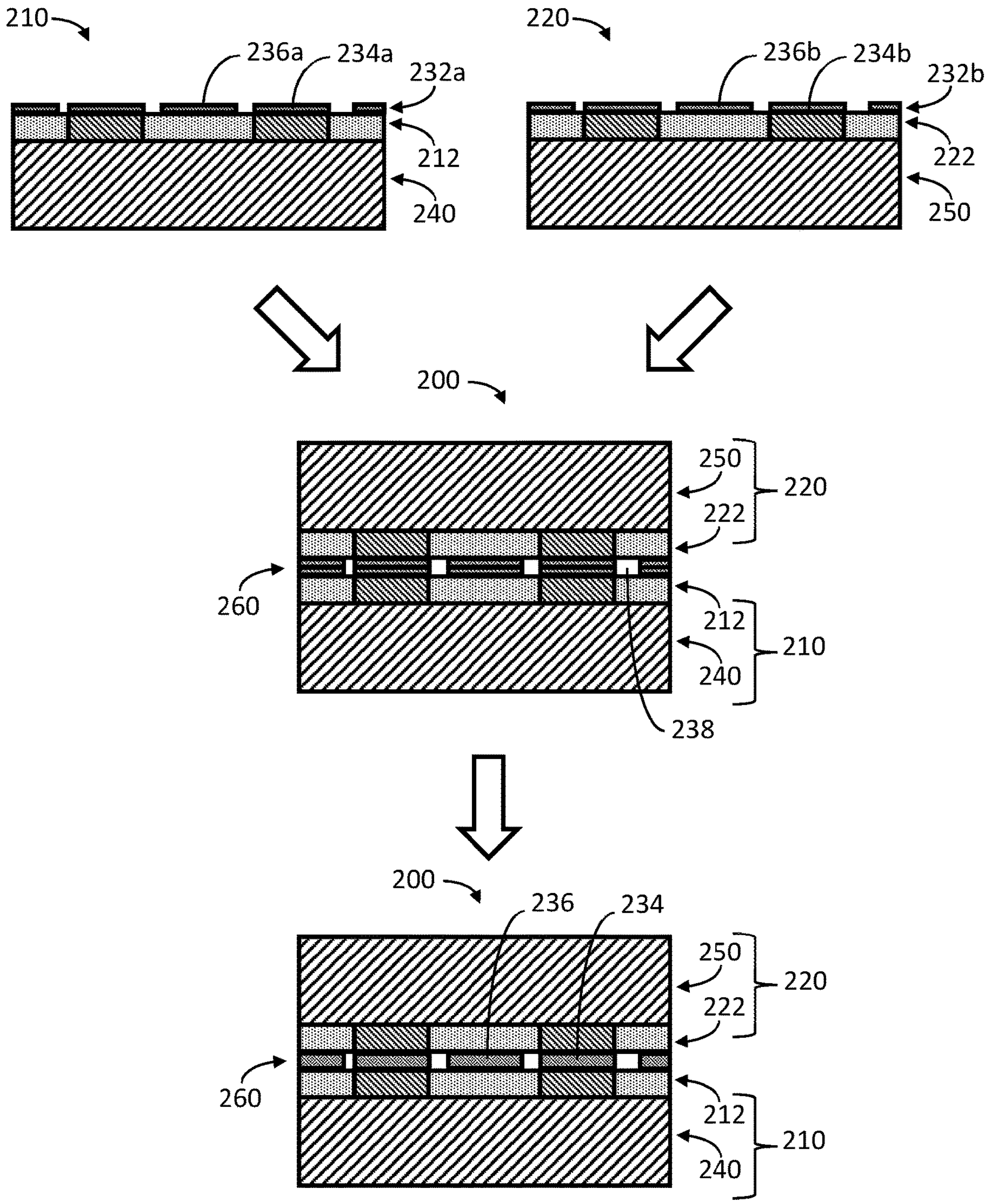
Figure 7A:
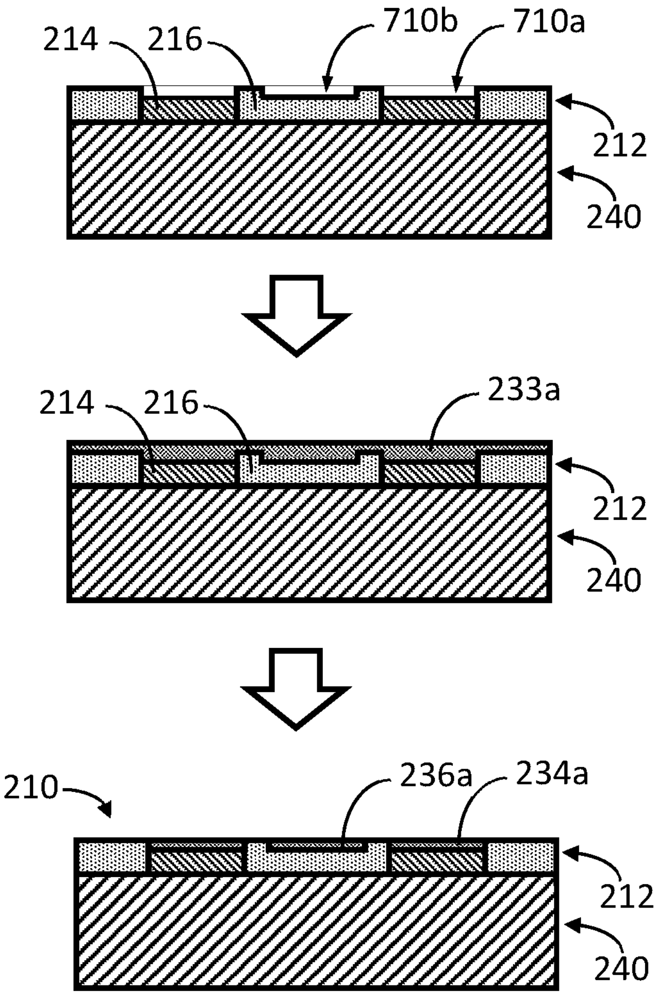
FIGS. 7A and 7B schematically illustrate the example method of FIG. 5 for forming the example structures of FIGS. 3A and 3B in accordance with certain implementations described herein.
Figure 7B:
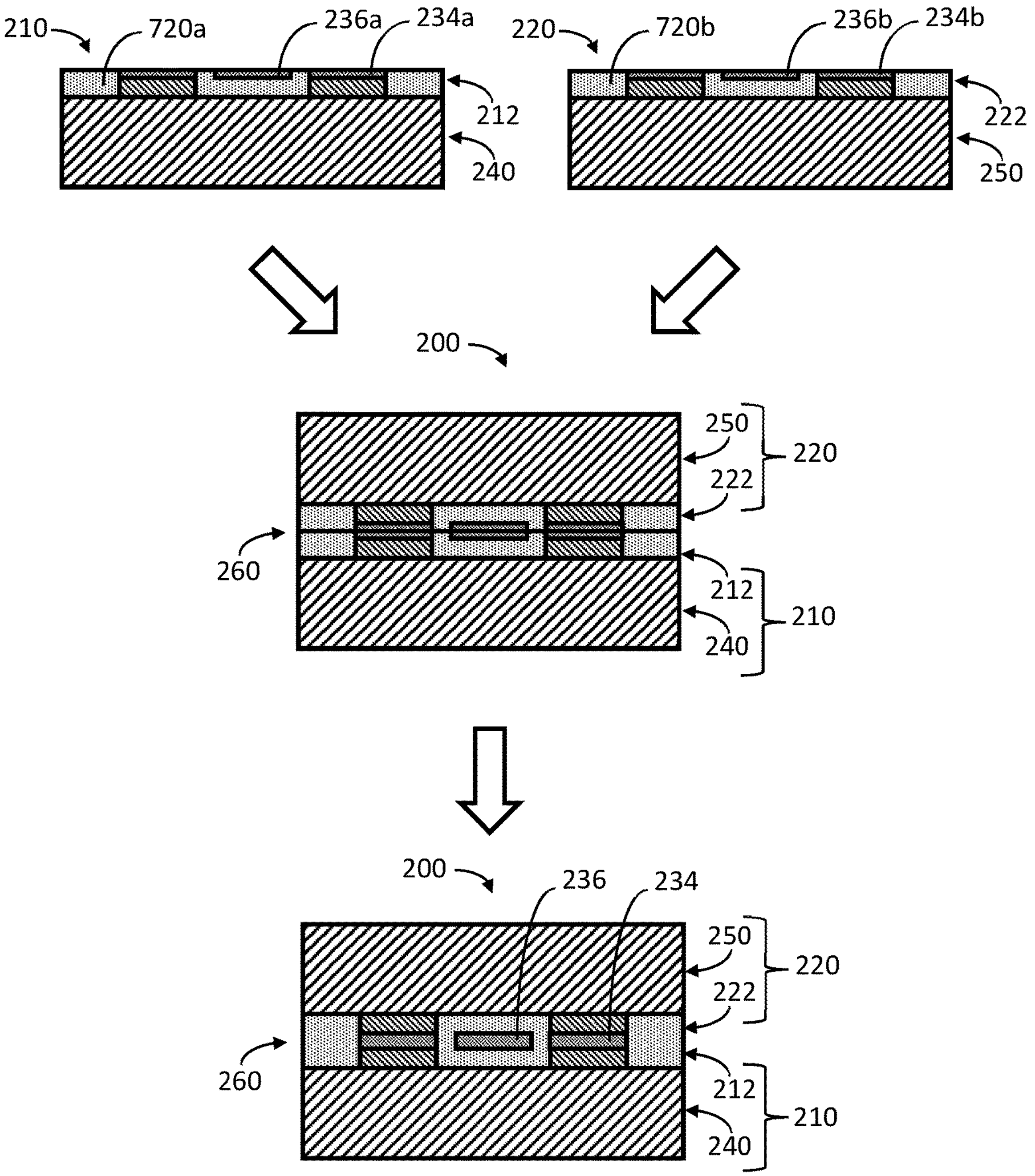
Figure 8A:
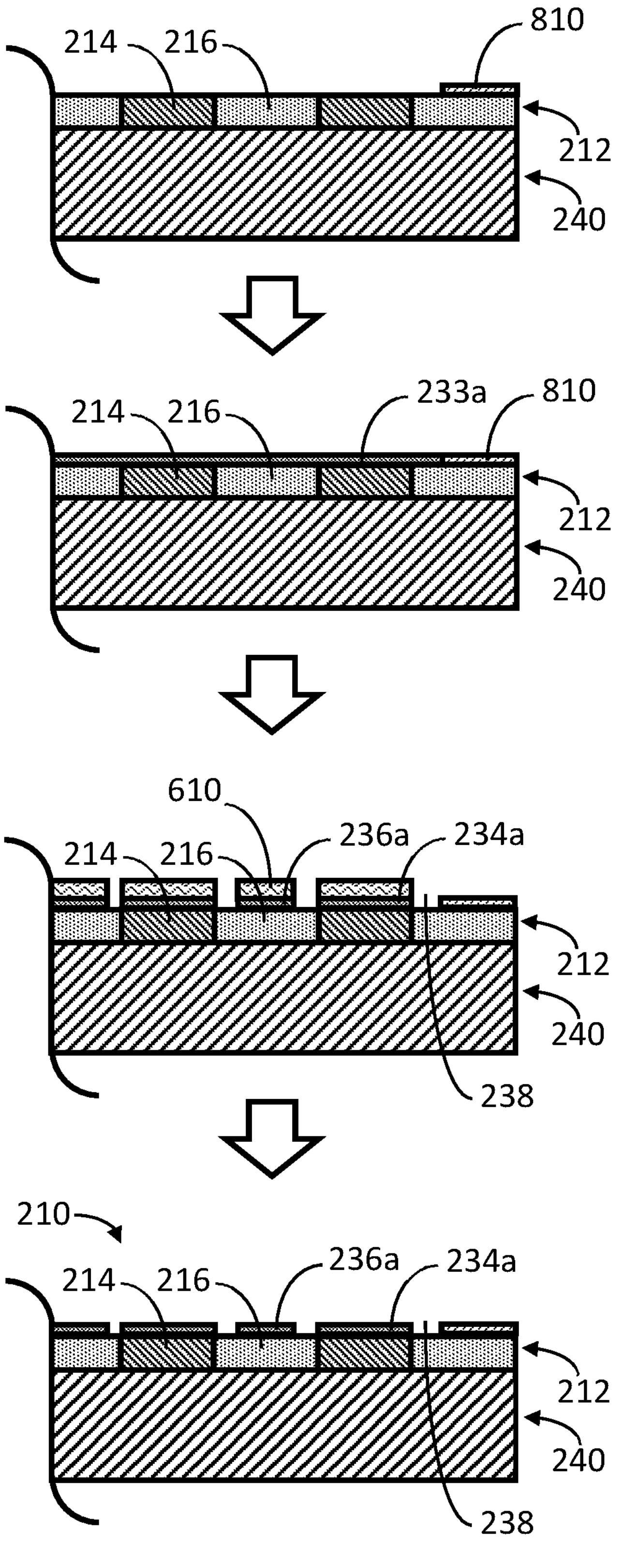
FIGS. 8A and 8B schematically illustrate still another example of the method of FIG. 5 for forming structures in accordance with certain implementations described herein.
Figure 8B:
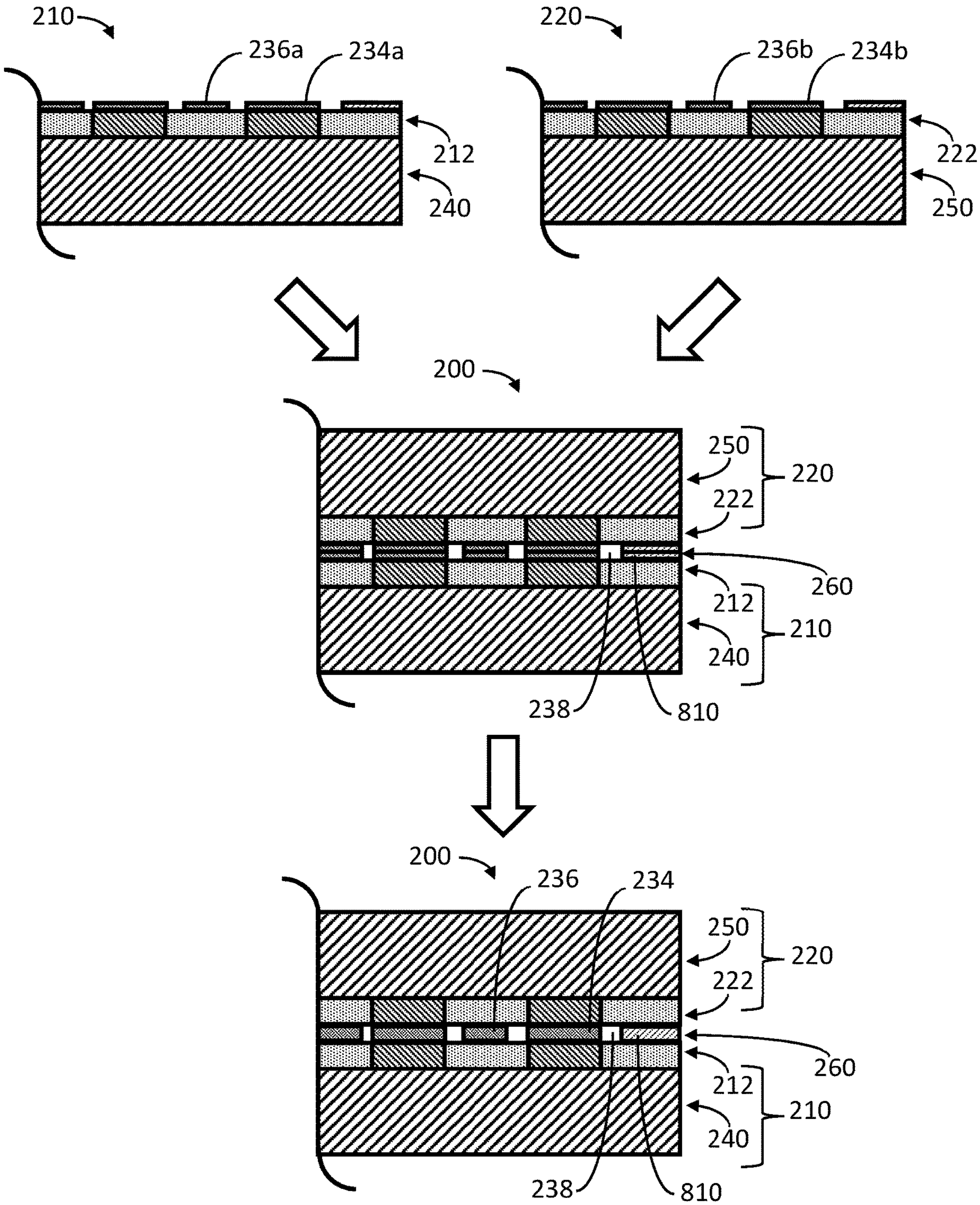

FIG. 5 is a flow diagram of an example method 500 for forming a structure 200 compatible with certain implementations described herein. FIGS. 6A and 6B schematically illustrate an example of the method 500 forming the example structures 200 of FIGS. 2A and 2B in accordance with certain implementations described herein. FIGS. 7A and 7B schematically illustrate another example of the method 500 forming the example structures 200 of FIGS. 3A and 3B in accordance with certain implementations described herein. FIGS. 8A and 8B schematically illustrate still another example of the method 500 forming the example structures 200 in accordance with certain implementations described herein. While the example method 500 is described herein by referring to the various example structures of FIGS. 2A, 2B, 3A, and 3B, other structures are also compatible with the example method 500 in accordance with certain implementations described herein.

In an operational block 510, the method 500 comprises providing a first substrate 210 (e.g., first element 102) and a second substrate 220 (e.g., second element 104). The first substrate 210 comprises one or more electrically conductive surface portions (e.g., first portions 214; conductive features 106*a*) and one or more electrically insulative surface portions (e.g., second portions 216) and the second substrate 220 comprises one or more electrically conductive surface portions (e.g., third portions 224; conductive features 106*b*) and one or more electrically insulative surface portions (e.g., fourth portions 226). At least one of the first substrate 210 and the second substrate 220 further comprises an electrically conductive oxide layer (e.g., an interface layer 230 comprises at least one electrically conductive oxide material 232) having a first region 234 over and in electrical communication with the one or more electrically conductive surface portions and a second region 236 over the one or more electrically insulative surface portions, the second region 236 electrically isolated from the first region 234. In an operational block 520, the method 500 further comprises directly bonding the first substrate 210 and the second substrate 220 with one another without an intervening adhesive. The directly bonding comprises contacting the first substrate 210 and the second substrate 220 with one another with the electrically conductive oxide surface layer therebetween.

In certain implementations, after the room temperature bonding operation, the bonded substrate 100 is annealed at a temperature higher than the room temperature (e.g., in a range of 120° C. to 500° C.; in a range of 120° C. to 150° C.; in a range of 150° C. to 350° C.) for an annealing time in a range of 10 minutes to more than 2 hours (e.g., higher annealing temperatures using shorter annealing times). The annealing ambient can comprise at least one of: nitrogen, forming gas, hydrogen plasma, vacuum, or other predetermined ambient. The annealing chamber can comprise one or more ovens (e.g., rapid thermal anneal (RTA) ovens; microwave ovens; ovens for processing semiconductor wafers, flat panels, etc.). After the annealing process, the opposing first and second bonding layers 108*a*, 108*b* can be permanently bonded and the bond energy of their bond interface 118 is at least 1000 $mJm^{-2}$ (e.g., higher than 2000 $mJm^{-2}$). Similarly, the opposing conductive features 106*a*, 106*b* can be mechanically bonded and electrically coupled to one another. The bond interface 118 at the bonded first and second bonding layers 108*a*, 108*b* can be linear or nonlinear within the bonded conductive features 106*a*, 106*b*. In certain implementations, the grain size of the annealed conductive features 106*a*, 106*b* is greater than 20% (e.g., greater than 30%) of a width of the bonded conductive features 106*a*, 106*b*.

In certain implementations, the first and second elements 102, 104 are annealed at a first temperature in a suitable oven, the first temperature sufficiently high to enlarge the grain structure of the conductive oxide before the bonding operation. The bonding surfaces of the first and second elements 102, 104 comprising conductive oxide with large grains can be cleaned and bonded. In certain such implementations, the cleaned surface can be activated before the bonding operation. The bonded first and second elements 102, 104 can be annealed at a second temperature that can be substantially equal to or greater than the first temperature. In certain implementations, the first and second elements 102, 104 are annealed at a first temperature (e.g., lower than 250° C.) before the planarization step to form smooth bonding surfaces 112*a*, 112*b*.

As schematically illustrated by FIGS. 6A, 7A, and 8A, the one or more electrically conductive surface portions can comprise the electrically conductive first portions 214 (e.g., Cu; Al; Cu alloy; Al alloy) of the first layer 212 on the at least one first device 240 and the one or more electrically insulative surface portions can comprise the electrically insulative second portions 216 (e.g., silicon oxycarbonitride or $SiO_xN_yC_z$) of the first layer 212 on the at least one first device 240. Similarly, the one or more electrically conductive surface portions can comprise the electrically conductive third portions 224 of the second layer 222 on the at least one second device 250 and the one or more electrically insulative surface portions can comprise the electrically insulative fourth portions 226 of the second layer 222 on the at least one second device 250. The top surfaces of the first portions 214 can be recessed (e.g., by less than 10 nanometers) relative to the top surfaces of the second portions 216 and/or the top surfaces of the third portions 224 can be recessed (e.g., by less than 10 nanometers) relative to the top surfaces of the fourth portions 226.

FIG. 6A schematically illustrates an example fabrication sequence of the operational block 510 for providing the first substrate 210. Providing the first substrate 210 in the operational block 510 can comprise depositing a first electrically conductive oxide layer 233*a* (e.g., ITO) over the first layer 212, with the first regions 234*a* over and in electrical communication with the one or more electrically conductive first portions 214 and the second regions 236*a* over the one or more electrically insulative second portions 216. For example, depositing the first electrically conductive oxide layer 233*a* can comprise sputtering, activated chemical vapor deposition (CVD), directional physical vapor deposition (PVD), or atomic layer deposition (ALD) to a thickness on the order of microns. In certain implementations, after depositing the first electrically conductive oxide layer 233*a*, the first electrically conductive oxide layer 233*a* can be planarized (e.g., using CMP; with a CMP rate of 50-60 nm/min for ITO).

Providing the first substrate 210 in the operational block 510 can further comprise patterning the first electrically conductive oxide layer 233*a* to electrically isolate the first regions 234*a* from the second regions 236*a*. For example, as shown in FIG. 6A, a photoresist layer 610 can be deposited on the first electrically conductive oxide layer 233*a*, the photoresist layer 610 can be patterned (e.g., using photolithographic techniques) to expose portions of the first electrically conductive oxide layer 233*a*, and the exposed portions of the first electrically conductive oxide layer 233*a* can be etched away to form gaps 238 between the first regions 234*a* and the second regions 236*a* (e.g., such that the second regions 236*a* do not electrically short the first regions 234*a* to one another). For example, patterning ITO can be performed using dilute HCl or HCl vapor in a plasma dry etch process or using $Cl_2$, $BCl_3$, $CH_4$, or $H_2$ as a dry etchant. After etching, the remaining photoresist layer 610 can be stripped off and the first substrate 210, including the first and second regions 234*a*, 236*a* of the first electrically conductive oxide layer 233*a*, can be cleaned (e.g., rinsed and spin dried) sufficiently for subsequent directly bonding.

While the example fabrication sequences of FIG. 6A is for fabricating the first substrate 210, starting with the first device 240 and the first layer 212, the same example fabrication sequences can be used for fabricating the second substrate 220, starting with the second device 250 and the second layer 222. For example, providing the second substrate 220 can comprise depositing a second electrically conductive oxide layer 233*b* over the second layer 222 with the first regions 234*b* over and in electrical communication with the one or more electrically conductive third portions 224 and the second regions 236*b* over the one or more electrically insulative fourth portions 226. In certain implementations, after depositing the second electrically conductive oxide layer 233*b*, the second electrically conductive oxide layer 233*b* can be planarized (e.g., using CMP). Said providing the second substrate 220 in the operational block 510 can further comprise patterning the second electrically conductive oxide layer 233*b* to electrically isolate the first regions 234*b* from the second regions 236*b* (e.g., depositing a photoresist layer on the second electrically conductive oxide layer 233*b*, patterning the photoresist layer 610 using photolithographic techniques to expose portions of the second electrically conductive oxide layer, and etching away the exposed portions of the second electrically conductive oxide layer to form gaps between the first regions 234*b* and the second regions 236*b*), such that the second regions 236*b* do not electrically short the first regions 234*b* to one another. After etching, the remaining photoresist layer can be stripped off and the second substrate 220, including the first and second regions 234*b*, 236*b* of the second electrically conductive oxide layer 233*b*, can be cleaned (e.g., rinsed and spin dried) sufficiently for subsequent directly bonding.

As schematically illustrated by FIG. 6B, directly bonding the first substrate 210 and the second substrate 220 with one another without an intervening adhesive comprises contacting the first and second substrates 210, 220 with one another with the at least one electrically conductive oxide surface layer therebetween (e.g., at room temperature; at temperatures below 35° C.). For example, as shown in FIG. 6B, the first patterned electrically conductive oxide layer 233*a* and the second patterned electrically conductive oxide layer 233*b* can be contacted with one another (e.g., with the first regions 234*a*, 234*b* contacting one another and the second regions 236*a*, 236*b* contacting one another). While FIG. 6B schematically illustrates certain implementations in which the second substrate 220 comprises the second electrically conductive oxide layer 233*b* over the second layer 222, in certain other implementations, the second substrate 220 does not comprise the second electrically conductive oxide layer 233*b* over the second layer 222, and directly bonding the first and second substrates 210, 220 with one another uses only the first electrically conductive oxide layer 233*a* between the first and second substrates 210, 220 (e.g., the first regions 234*a* in electrical contact with the first portions 214 and third portions 224 and the second regions 236*a* in contact with the second portions 216 and fourth portions 226). The alignment between the first regions 234 with the first and third portions 214, 224 and the alignment between the second regions 236 and the second and fourth portions 216, 226 can be sufficient to provide substantial electrical contact between the first and third portions 214, 224 where desired while avoiding electrically shorting the first regions 234 to one another (e.g., the alignment can be less than perfect).

In certain implementations, the method 500 can further comprise, after contacting the first and second substrates 210, 220 with one another, annealing the structure 200 (e.g., heating to a predetermined temperature higher than room temperature for a predetermined time period; at temperatures in a range of 120° C. to 300° C.). The annealing process can cause the electrically conductive oxide layers 233*a*, 233*b* to expand to increase contact pressure between opposing conductive regions. Annealing can additionally or alternatively cause grain growth across the bond interface such that the grains can migrate at least partially into the opposing element. In certain implementations, the method 500 does not comprise activating (e.g., exposing to a plasma and/or chemical etchants) at least one of the first and second electrically conductive oxide layers 233*a*, 233*b* (e.g., both of the electrically conductive oxide layers 233*a*, 233*b*) after the cleaning. As shown in FIG. 6B, the periphery 260 of the structure 200 comprises the electrically conductive oxide material 232 (e.g., ITO), which can provide hermiticity to the components within the region bounded by the periphery 260.

FIG. 7A schematically illustrates another example fabrication sequence of the operational block 510 for providing the first substrate 210. As shown in FIG. 7A, the first portions 214 of the first layer 212 comprise recesses 710*a* relative to the second portions 216 of the first layer 212 (e.g., the top surface of the first portions 214 is recessed relative to the top surface of the second portions 216 by a depth in a range of 3 nm to 40 nm; the recesses can be formed by Cu polishing), and recesses 710*b* (e.g., having a depth in a range of 3 nm to 40 nm) at the top surface of the second portions 216. Providing the first substrate 210 in the operational block 510 can comprise depositing a first electrically conductive oxide layer 233*a* (e.g., ITO; SnO) over the first layer 212, thereby substantially filling the recesses 710*a*, 710*b* with the first electrically conductive oxide material 232. For example, depositing the first electrically conductive oxide layer 233*a* can comprise sputtering, activated CVD, directional PVD, or ALD to a thickness on the order of microns. After depositing the first electrically conductive oxide layer 233*a*, the first electrically conductive oxide layer 233*a* can be planarized (e.g., using CMP) to remove the portions of the first electrically conductive oxide material 232 outside the recesses 710*a*, 710*b*, thereby forming the first regions 234*a* over and in electrical communication with the one or more electrically conductive first portions 214 and the second regions 236*a* over the one or more electrically insulative second portions 216. The top surface of the first electrically conductive oxide material 232 can be recessed relative to the top surface of the adjacent second portions 216 (e.g., in a range of 2 nanometers to 8 nanometers) to account for the differing coefficients of thermal expansion (CTE) of the electrically conductive oxide material 232 and the material of the second portions 216 (e.g., differing amounts of thermal expansion in a direction perpendicular to the top surfaces during subsequent annealing). For example, the CTE of ITO is about $5.8\times10^{-6}$/K to $9\times10^{-6}$/K while the CTE of silicon oxide is about $0.5\times10^{-6}$/K. For comparison, the CTE of Cu is about $16.7\times10^{-6}$/K. The thickness of the ITO can be selected to be thicker and the magnitude of the recess between the ITO and the neighboring silicon oxide can be more tightly controlled to account for the smaller CTE differential for ITO/$SiO_2$.

In this way, the first and second regions 234*a*, 236*a* can be formed and can be electrically isolated from one another without a patterning step. After planarization, the first substrate 210, including the first and second regions 234*a*, 236*a* of the first electrically conductive oxide layer 233*a*, can be cleaned (e.g., rinsed and spin dried) sufficiently for subsequent directly bonding.

While the example fabrication sequences of FIG. 7A is for fabricating the first substrate 210, starting with the first device 240 and the first layer 212, the same example fabrication sequences can be used for fabricating the second substrate 220, starting with the second device 250 and the second layer 222.

As schematically illustrated by FIG. 7B, directly bonding the first substrate 210 and the second substrate 220 with one another without an adhesive comprises contacting the first and second substrates 210, 220 with one another with the first and second electrically conductive oxide surface layers 233*a*, 233*b* therebetween (e.g., at room temperature; at temperatures below 35° C.). For example, as shown in FIG. 7B, the first electrically conductive oxide layer 233*a* and the second electrically conductive oxide layer 233*b* can be contacted with one another (e.g., with the first regions 234*a*, 234*b* contacting one another and the second regions 236*a*, 236*b* contacting one another). In addition, the first dielectric regions 720*a* of the first layer 212 and the second dielectric regions 720*b* of the second layer 222 can be contacted with one another and directly bonded to one another. For example, if the first dielectric regions 720*a* and/or the second dielectric regions **720*b* is polished and activated, the first and second dielectric regions 720*a,b* can bond to one another at room temperature (e.g., before annealing; before the first and second electrically conductive oxide layers 233*a,b* bond to one another). While FIG. 7B schematically illustrates certain implementations in which the second substrate 220 comprises the second electrically conductive oxide layer 233*b* over the second layer 222, in certain other implementations, the second substrate 220 does not comprise the second electrically conductive oxide layer 233*b* over the second layer 222, and directly bonding the first and second substrates 210, 220 with one another uses only the first electrically conductive oxide layer 233*a* between the first and second substrates 210, 220 (e.g., the first regions 234*a* in electrical contact with the first portions 214 and third portions 224 and the second regions 236*a* in contact with the second portions 216 and fourth portions 226). The alignment between the first regions 234 with the first and third portions 214, 224 and the alignment between the second regions 236 and the second and fourth portions 216, 226 can be sufficient to provide substantial electrical contact between the first and third portions 214, 224 where desired while avoiding electrically shorting the first regions 234** to one another (e.g., the alignment can be less than perfect).

In certain implementations, the method 500 can further comprise, after contacting the first and second substrates 210, 220 with one another, annealing the structure 200 (e.g., heating to a predetermined temperature higher than room temperature for a predetermined time period; at temperatures in a range of 150° C. to 300° C.). As explained above, the annealing process can cause the electrically conductive oxide layers **233*a*, 233*b* to expand to increase contact pressure between opposing conductive regions. Annealing can additionally or alternatively cause grain growth across the bond interface such that the grains can migrate at least partially into the opposing element. In certain implementations, the method 500 does not comprise activating (e.g., exposing to a plasma and/or chemical etchants) at least one of the first and second electrically conductive oxide layers 233*a*, 233*b* (e.g., both of the electrically conductive oxide layers 233*a*, 233*b*) after the cleaning. As shown in FIG. 7B, the periphery 260 of the structure 200 comprises the solid dielectric material 270 (e.g., silicon oxycarbonitride or $SiO_xN_yC_z$) which provides higher hermeticity to the components within the region bounded by the periphery 260 than would the at least one electrically conductive oxide material 232**.

Beneficially, in certain implementations of the methods shown in FIGS. 6A-7B), the first and second substrates 210, 220 can be directly bonded without activating either substrate. For example, the first substrate 210 and the second substrate 220 may not be activated after the patterning of the conductive oxide layers **233*a*, 233*b* (which can serve as conductive contact features) and prior to the directly bonding. Additionally or alternatively, in certain implementations, at least one of the substrates 210, 220 may not be planarized after patterning the conductive oxide layers 233*a*, 233*b* and prior to the directly bonding. Omitting one or both of these steps can simplify the direct bonding process flow and reduce manufacturing costs. Without being limited by theory, the material properties of the conductive oxide layers 233*a*, 233*b* can form direct bonds after a low temperature anneal without requiring planarization and/or activation. As explained above, annealing can cause expansion of the conductive oxide layers 233*a*, 233*b*, and/or can cause grain growth to facilitate electrical connection between opposing conductive regions. In other embodiments, one or both substrates 210, 220 can be planarized and/or activated after patterning the layers 233*a*, 233*b*** and before direct bonding.

FIG. 8A schematically illustrates an example fabrication sequence of the operational block 510 for providing the first substrate 210. The fabrication sequence of FIG. 8A is similar to that of FIG. 6A as described herein, but a solid dielectric layer 810 (e.g., either the same material as the second portion 216 or a different material) is over the portion of the first layer 212 (e.g., the electrically insulative second portion 216) that will be at the periphery 260 of the structure 200. As described herein with regard to FIG. 6A, providing the first substrate 210 in the operational block 510 can comprise depositing a first electrically conductive oxide layer **233*a* (e.g., ITO) over the first layer 212 (e.g., by sputtering, activated CVD, directional PVD, or ALD to a thickness on the order of microns). In certain implementations, after depositing the first electrically conductive oxide layer 233*a*, the first electrically conductive oxide layer 233*a* can be planarized (e.g., using CMP) to remove conductive oxide material 232 on the solid dielectric layer 810**.

Providing the first substrate 210 in the operational block 510 can further comprise patterning the first electrically conductive oxide layer **233*a* to electrically isolate the first regions 234*a* from the second regions 236*a*. For example, as shown in FIG. 8A, a photoresist layer 610 can be deposited on the planarized first electrically conductive oxide layer 233*a*, the photoresist layer 610 can be patterned (e.g., using photolithographic techniques) to expose portions of the planarized first electrically conductive oxide layer 233*a*, and the exposed portions of the planarized first electrically conductive oxide layer 233*a* can be etched away to form gaps 238 between the first regions 234*a* and the second regions 236*a* (e.g., such that the second regions 236*a* do not electrically short the first regions 234*a* to one another). After etching, the remaining photoresist layer 610 can be stripped off and the first substrate 210, including the first and second regions 234*a*, 236*a* of the first electrically conductive oxide layer 233*a*, can be cleaned (e.g., rinsed and spin dried) sufficiently for subsequent directly bonding. While the example fabrication sequences of FIG. 8A is for fabricating the first substrate 210, starting with the first device 240 and the first layer 212, the same example fabrication sequences can be used for fabricating the second substrate 220, starting with the second device 250 and the second layer 222, with a solid dielectric layer 810 over the portion of the second layer 222 (e.g., the electrically insulative fourth portion 226) that will be at the periphery 260 of the structure 200 (e.g., either the same material as the fourth portion 226** or a different material).

As schematically illustrated by FIG. 8B, directly bonding the first substrate 210 and the second substrate 220 with one another without an adhesive can comprise contacting the first and second substrates 210, 220 with one another with the at least one electrically conductive oxide surface layer therebetween (e.g., at room temperature; at temperatures below 35° C.). While FIG. 8B schematically illustrates certain implementations in which the second substrate 220 comprises an electrically conductive oxide layer over the second layer 222, in certain other implementations, the second substrate 220 does not comprise an electrically conductive oxide layer over the second layer 222, and directly bonding the first and second substrates 210, 220 with one another uses only the first electrically conductive oxide layer **233*a* between the first and second substrates 210, 220 (e.g., the first regions 234*a* in electrical contact with the first portions 214 and third portions 224 and the second regions 236*a* in contact with the second portions 216** and fourth portions 226). The alignment between the first regions 234 with the first and third portions 214, 224 and the alignment between the second regions 236 and the second and fourth portions 216, 226 can be sufficient to provide substantial electrical contact between the first and third portions 214, 224 where desired while avoiding electrically shorting the first regions 234 to one another (e.g., the alignment can be less than perfect).

As described herein with regard to FIGS. 6B and 7B, the method 500 can further comprise, after contacting the first and second substrates 210, 220 with one another, annealing the structure 200 and/or not activating the electrically conductive oxide layer after the cleaning. As shown in FIG. 8B, the periphery 260 of the structure 200 comprises the solid dielectric layer 810, providing hermiticity to the components within the region bounded by the periphery 260.

Figure 9A:
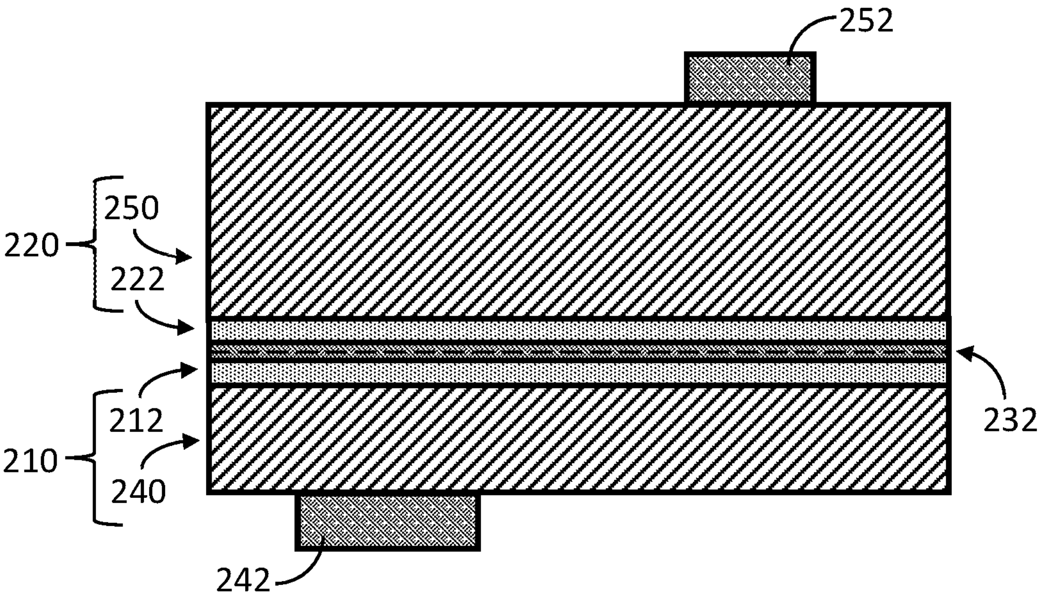
FIGS. 9A and 9B schematically illustrate another example structure and method for forming the structure in accordance with certain implementations described herein.
Figure 9B:
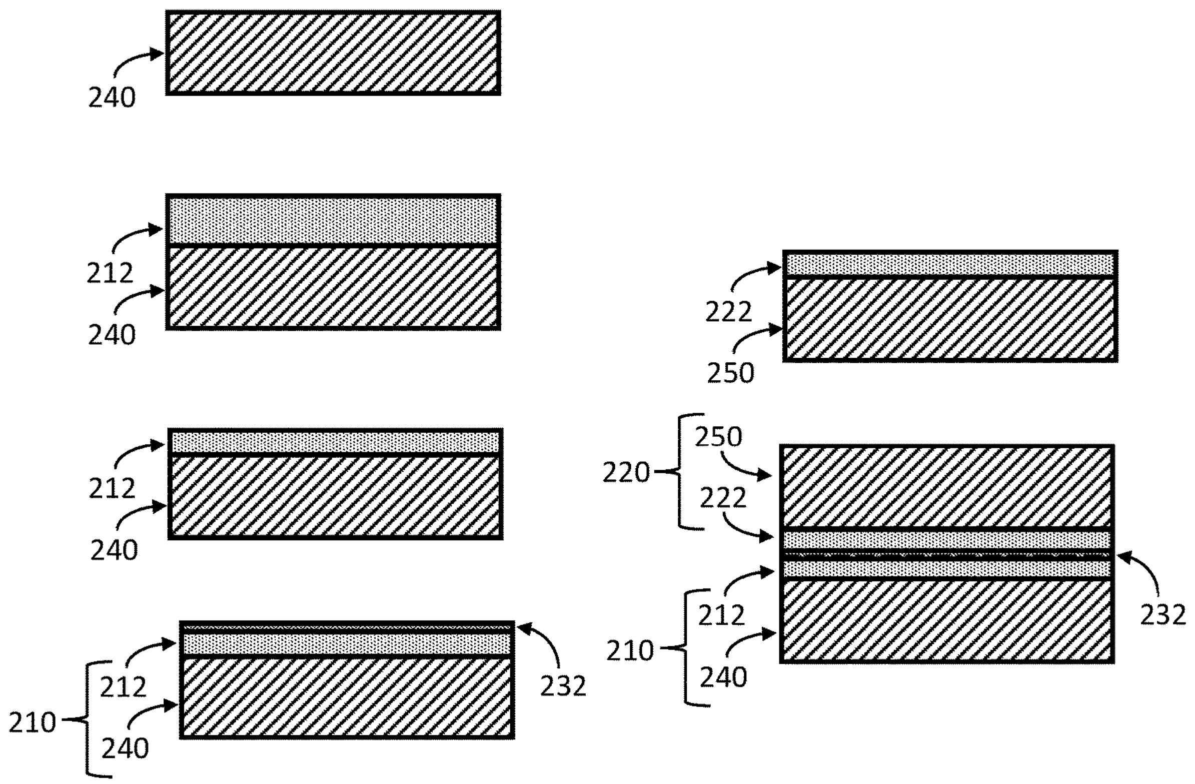

FIG. 9A is a schematic side sectional view of a bonded structure in accordance with certain implementations described herein. FIG. 9B is an example process flow in accordance with certain implementations described herein for forming the bonded structure of FIG. 9A. Unless otherwise noted, the components of FIGS. 9A-9B may be the same as or generally similar to like-numbered components of FIGS. 2A-4F and 6A-8B. However, unlike certain implementations described above, in FIGS. 9A-9B, the electrically conductive oxide material(s) 232 may be blanket deposited over one or both first and second substrates 210, 220, with portions of the electrically conductive oxide material 232 deposited on dielectric oxide materials electrically isolated from portions of the electrically conductive oxide material 232 deposited on electrically conductive materials (e.g., metal pads). For example, as shown in FIG. 7B, the first device 240 (which can comprise a semiconductor portion, such as a silicon portion) can be provided, and a first layer 212 comprising a first dielectric material can be deposited over the first device 240. The electrically conductive oxide material 232 can be deposited over the first dielectric material of the first layer 212. In certain implementations, the first dielectric material of the first layer 212 can comprise an inorganic dielectric, such as silicon oxide, silicon nitride, etc. In certain implementations, the second device 250 (which can comprise a semiconductor portion, such as a silicon portion) can be fabricated in a similar manner. For example, a second layer 222 comprising a second dielectric material can be deposited over the second device 250. In certain implementations, a portion of the conductive oxide material 232 can also be blanket deposited over the second dielectric material of the second layer 222. In certain implementations, the conductive oxide material 232 can be deposited only on the first substrate 210. The first and second substrates 210, 220 can be directly bonded to one another. In certain implementations, as explained above, neither the first nor second substrate 210, 220 may be activated prior to direct bonding. Additionally or alternatively, one or both of the first and second substrates 210, 220 may not be planarized or polished prior to direct bonding. In certain other implementations, however, one or both of the first and second substrates 210, 220 can be planarized and/or activated prior to direct bonding.

Table 1 lists example combinations of materials for the first regions 234*a*, 234*b* (e.g., the at least one conductive oxide material 232) and materials of the electrically conductive first and third portions 214, 224 of the first and second substrates 210, 220 in accordance with certain implementations described herein. Table 2 lists example combinations of materials for the second regions 236*a*, 236*b* (e.g., the at least one conductive oxide material 232) and materials of the electrically insulative second and fourth portions 216, 226 of the first and second substrates 210, 220 in accordance with certain implementations described herein. In each of Tables 1 and 2, absence of a listed material denotes that the at least one conductive oxide material 232 is only on one of the first and second substrates 210, 220 prior to contacting the first and second substrates 210, 220 to one another. Various stoichiometries of the at least one conductive oxide material 232 are compatible with certain implementations described herein and can play a role in the strength of the bond.

TABLE 1

| | | | | | | |
|---|---|---|---|---|---|---|
| First portion 214 | W | Co | ZnO | ZnO | W | Co |
| First regions 234a | ITO | ITO | ITO | ITO | ITO | ITO |
| First regions 234b | ITO | ITO | ITO | | | ZnO |
| Third portions 224 | W | W | ZnO | ZnO | ZnO | W |

TABLE 2

| | | | | | |
|---|---|---|---|---|---|
| Second portion 216 | $SiO_2$ | $SiO_2$ | SiN | $SiO_2$ | $SiO_2$ |
| Second regions 236a | ITO | ITO | ITO | ITO | ITO |
| Second regions 236b | ITO | | ITO | ZnO | ITO |
| Fourth portions 226 | $SiO_2$ | $SiO_2$ | $SiO_2$ | SiN | Cu/TiN |

In certain implementations, the bonded structures 200 can be coated with a protective layer, mounted on a dicing sheet, and singulated (e.g., by saw dicing, laser dicing, reactive ion etch dicing, wet etching, or a combination thereof) to form singulated dies on the dicing frame. The protective layer can be removed (e.g., stripped) from the singulated dies and the exposed dicing sheet (e.g., using solvent, reactive ion etching, etc.). The singulated die can be cleaned (e.g., rinsed and dried using spin drying or other processes). The cleaned dies can be configured for subsequent processes. For example, a cleaned die can be further bonded to a prepared surface of another substrate (e.g., comprising a power pad, ground pads, and/or other passive elements configured to transmit power to the bonded die).

Figure 10:
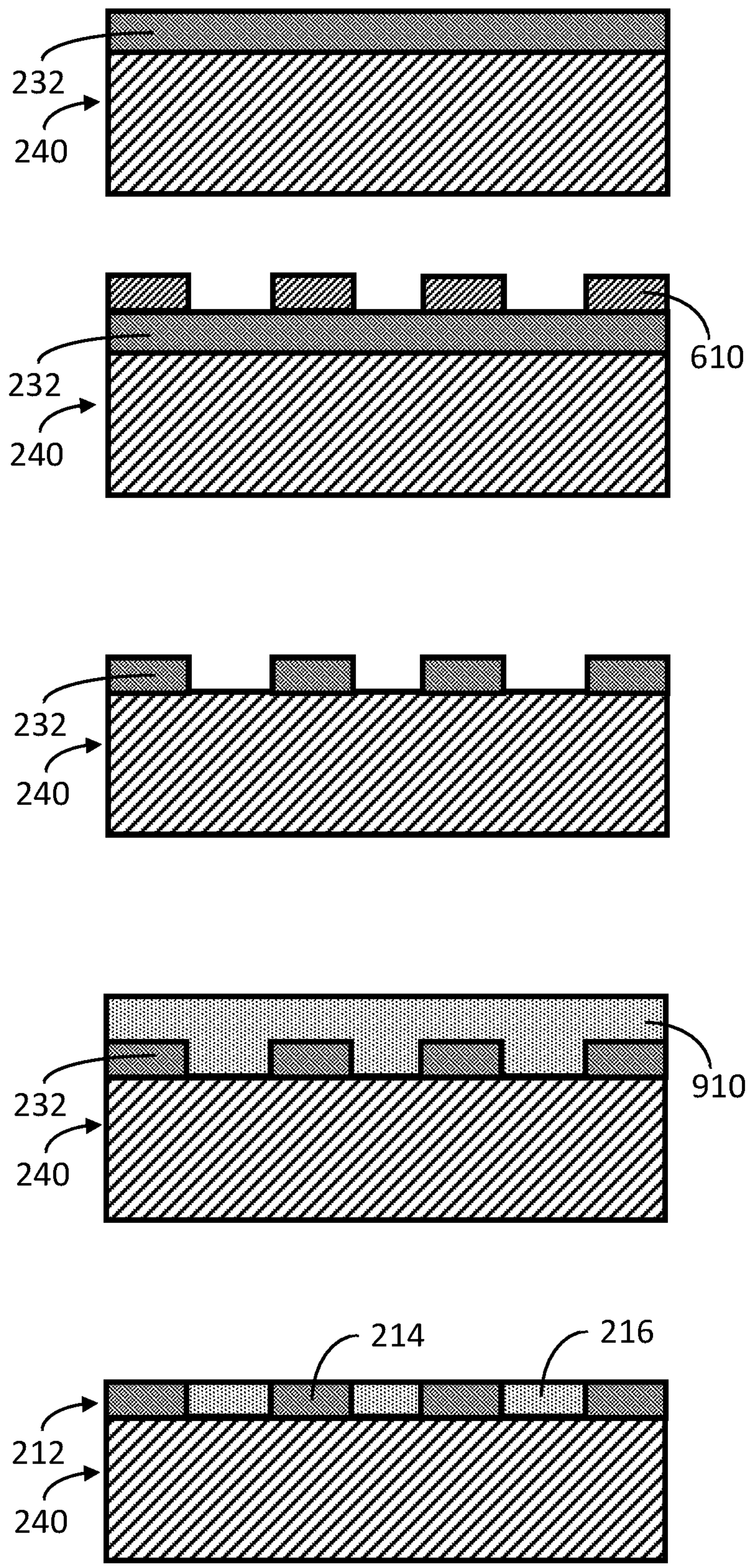
FIG. 10 schematically illustrates an example build-up process flow for forming the structure in accordance with certain implementations described herein.

FIG. 10 schematically illustrates an example build-up process flow for forming the structure in accordance with certain implementations described herein. The at least one conductive oxide material 232 (e.g., ITO) can facilitate the build-up process flow. In addition, a similar process can be used to have a multi-layer metal layer as well (e.g., with transparent conductors above Cu or Al pads). For example, the at least one conductive oxide material 232 can be deposited onto a first substrate 210 or functional wafer device 240, a photoresist layer 610 can be deposited on the at least one conductive oxide material 232, the photoresist layer 610 can be patterned (e.g., using photolithographic techniques) to expose portions of the at least one conductive oxide material 232, and the exposed portions of the at least one conductive oxide material 232 can be etched away to form gaps. For example, patterning ITO can be performed using dilute HCl or HCl vapor in a plasma dry etch process or using $Cl_2$, $BCl_3$, $CH_4$, or $H_2$ as a dry etchant. After etching, the remaining photoresist layer 610 can be stripped off, and a dielectric layer 910 can be deposited over the at least one conductive oxide material 232 and the first substrate 210 or functional wafer device 240 within the gaps, and excess dielectric material can be removed (e.g., using CMP), leaving a planar first layer 212 for bonding, which can be cleaned (e.g., rinsed and spin dried) sufficiently for subsequent directly bonding. The planar first layer 212 can comprise the at least one conductive oxide material 232 as the first portions 214 and the dielectric material in the gaps as the second portions 216. The at least one conductive oxide material 232 can be configured to mate with active input/output pads on a second functional wafer device 250.

Although commonly used terms are used to describe the systems and methods of certain implementations for ease of understanding, these terms are used herein to be interpreted fairly. Although various aspects of the disclosure are described with regard to illustrative examples and implementations, the disclosed examples and implementations should not be construed as limiting. Conditional language, such as, among others, “can,” “could,” “might,” or “may,” unless specifically stated otherwise, or otherwise understood within the context as used, is generally intended to convey that certain implementations include, while other implementations do not include, certain features, elements and/or steps. Thus, such conditional language is not generally intended to imply that features, elements and/or steps are in any way required for one or more implementations or that one or more implementations necessarily include logic for deciding, with or without user input or prompting, whether these features, elements and/or steps are included or are to be performed in any particular implementation. In particular, the terms “comprises” and “comprising” should be interpreted as referring to elements, components, or steps in a non-exclusive manner, indicating that the referenced elements, components, or steps may be present, or utilized, or combined with other elements, components, or steps that are not expressly referenced.

It is to be appreciated that the implementations disclosed herein are not mutually exclusive and may be combined with one another in various arrangements. In addition, although the disclosed methods and apparatuses have largely been described in the context of direct bonding processes, various implementations described herein can be incorporated in a variety of other suitable devices, methods, and contexts.

Language of degree, as used herein, such as the terms “approximately,” “about,” “generally,” and “substantially,” represent a value, amount, or characteristic close to the stated value, amount, or characteristic that still performs a desired function or achieves a desired result. For example, the terms “approximately,” “about,” “generally,” and “substantially” may refer to an amount that is within ±10% of, within ±5% of, within ±2% of, within ±1% of, or within ±0.1% of the stated amount. As another example, the terms “generally parallel” and “substantially parallel” refer to a value, amount, or characteristic that departs from exactly parallel by ±10 degrees, by ±5 degrees, by ±2 degrees, by ±1 degree, or by ±0.1 degree, and the terms “generally perpendicular” and “substantially perpendicular” refer to a value, amount, or characteristic that departs from exactly perpendicular by ±10 degrees, by ±5 degrees, by ±2 degrees, by ±1 degree, or by ±0.1 degree. The ranges disclosed herein also encompass any and all overlap, sub-ranges, and combinations thereof. Language such as “up to,” “at least,” “greater than,” less than,” “between,” and the like includes the number recited. As used herein, the meaning of “a,” “an,” and “said” includes plural reference unless the context clearly dictates otherwise. Also, as used in the description herein, the meaning of “in” includes “into” and “on,” unless the context clearly dictates otherwise.

While the methods and systems are discussed herein in terms of elements labeled by ordinal adjectives (e.g., first, second, etc.), the ordinal adjective are used merely as labels to distinguish one element from another (e.g., one substrate from another or one surface layer from one another), and the ordinal adjective is not used to denote an order of these elements or of their use.

The disclosure described and claimed herein is not to be limited in scope by the specific example implementations herein disclosed, since these implementations are intended as illustrations, and not limitations, of several aspects of the disclosure. Any equivalent implementations are intended to be within the scope of this disclosure. Indeed, various modifications of the disclosure in form and detail, in addition to those shown and described herein, will become apparent to those skilled in the art from the foregoing description. Such modifications are also intended to fall within the scope of the claims. The breadth and scope of the disclosure should not be limited by any of the example implementations disclosed herein, but should be defined only in accordance with the claims and their equivalents.

What is claimed is:

1. A structure comprising:

a first substrate comprising a first layer having at least one electrically conductive first portion and at least one electrically insulative second portion;

a second substrate comprising a second layer having at least one electrically conductive third portion and at least one electrically insulative fourth portion; and an interface layer between the first layer and the second layer, the interface layer comprising at least one electrically conductive oxide material, the at least one electrically conductive oxide material comprising:

at least one first region between and in electrical communication with the at least one electrically conductive first portion and the at least one electrically conductive third portion; and at least one second region between the at least one electrically insulative second portion and the at least one electrically insulative fourth portion, the at least one electrically conductive oxide material of the at least one second region embedded within the at least one electrically insulative second portion and within the at least one electrically insulative fourth portion, the at least one second region electrically isolated from the at least one first region.

2. The structure of claim 1, wherein the at least one electrically conductive oxide material is optically transparent.

3. The structure of claim 2, wherein the at least one electrically conductive oxide material comprises indium tin oxide or zinc oxide.

4. The structure of claim 1, wherein the at least one electrically conductive oxide material comprises a first electrically conductive oxide material on the first layer and a second electrically conductive oxide material on the second layer, the first electrically conductive oxide material directly bonded to the second electrically conductive oxide material.

5. The structure of claim 1, wherein the at least one electrically conductive first portion and/or the at least one electrically conductive third portion is selected from the group consisting of: copper, tungsten, cobalt, or zinc oxide.

6. The structure of claim 1, wherein the at least one electrically insulative second portion and/or the at least one electrically insulative fourth portion is selected from the group consisting of: silicon oxide, silicon nitride, copper nitride, and titanium nitride.

7. The structure of claim 1, wherein a portion of the at least one electrically conductive oxide material at a periphery of the first and second substrates hermetically seals a second portion of the at least one electrically conductive oxide material from an ambient environment.

8. The structure of claim 1, wherein the interface layer further comprises at least one solid dielectric material between the at least one first region and the at least one second region.

9. The structure of claim 8, wherein the at least one solid dielectric material comprises silicon oxycarbonitride.

10. The structure of claim 8, wherein a portion of the at least one solid dielectric material at a periphery of the first and second substrates hermetically seals the at least one first region and the at least one second region from an ambient environment.

11. The structure of claim 10, wherein the at least one solid dielectric material substantially surrounds the at least one first region and the at least one second region.

12. The structure of claim 8, wherein the at least one electrically conductive oxide material is embedded in the at least one solid dielectric material.

13. A method comprising:
- providing a first substrate and a second substrate each comprising one or more electrically conductive surface portions and one or more electrically insulative surface portions, at least one of the first substrate and the second substrate further comprising an electrically conductive oxide layer having a first region over and in electrical communication with the one or more electrically conductive surface portions and a second region over the one or more electrically insulative surface portions, the second region electrically isolated from the first region; and
- directly bonding the first substrate and the second substrate with one another without an intervening adhesive, wherein directly bonding the first substrate and the second substrate comprises contacting the first substrate and the second substrate with one another with the electrically conductive oxide layer therebetween, wherein providing the first substrate comprises:
  - depositing a first electrically conductive oxide layer over the one or more electrically conductive surface portions and the one or more electrically insulative surface portions; and
  - patterning the first electrically conductive oxide layer to electrically isolate the first region from the second region.

14. The method of claim 13, wherein providing the second substrate comprises:
- depositing a second electrically conductive oxide layer over the one or more electrically conductive surface portions and the one or more electrically insulative surface portions; and
- patterning the second electrically conductive oxide layer to electrically isolate the first region from the second region.

15. The method of claim 14, wherein directly bonding the first substrate and the second substrate further comprises contacting the first patterned electrically conductive oxide layer and the second patterned electrically conductive oxide layer with one another.

16. The method of claim 13, wherein patterning the first electrically conductive oxide layer comprises:
- depositing a photoresist layer over the deposited first electrically conductive oxide layer;
- patterning the photoresist layer to expose portions of the first electrically conductive oxide layer;
- etching away the exposed portions of the first electrically conductive oxide layer; and
- stripping off the photoresist layer.

17. The method of claim 13, wherein patterning the first electrically conductive oxide layer comprises planarizing the first electrically conductive oxide layer.

18. The method of claim 17, wherein the one or more electrically conductive surface portions have recesses relative to the one or more electrically insulative surface portions, wherein depositing the first electrically conductive oxide layer comprises filling the recesses with the first electrically conductive oxide layer, and wherein planarizing the first electrically conductive oxide layer comprises removing portions of the first electrically conductive oxide layer that are outside the recesses.

19. The method of claim 17, wherein the one or more electrically insulative surface regions have recesses, wherein depositing the first electrically conductive oxide layer comprises filling the recesses with the first electrically conductive oxide layer, and wherein planarizing the first electrically conductive oxide layer comprises removing portions of the first electrically conductive oxide layer that are outside the recesses.

20. The method of claim 19, further comprising:
- depositing a photoresist layer over the planarized first electrically conductive oxide layer;
- patterning the photoresist layer to expose portions of the planarized first electrically conductive oxide layer;
- etching away the exposed portions of the planarized first electrically conductive oxide layer; and
- stripping off the photoresist layer.

21. The method of claim 13, further comprising cleaning at least one of the first and second substrates prior to contacting the first and second substrates with one another.

22. The method of claim 13, further comprising annealing the first and second substrates after contacting the first and second substrates with one another.

23. The structure of claim 1, wherein the at least one electrically insulative second portion and the at least one electrically insulative fourth portion are directly bonded to one another.

24. The structure of claim 23, wherein the at least one electrically conductive first portion of the first substrate and the at least one electrically conductive third portion of the second substrate are directly bonded to the at least one electrically conductive oxide material such that the first substrate and the second substrate are hybrid bonded to one another.

25. The structure of claim 1, wherein a first portion of the interface layer is on the first substrate and a second portion of the interface layer is on the second substrate, and the first substrate and the second substrate are hybrid bonded to one another.

* * * * *